(12) United States Patent
Tani

(10) Patent No.: US 9,192,066 B2
(45) Date of Patent: Nov. 17, 2015

(54) PORTABLE TERMINAL DEVICE

(75) Inventor: Minako Tani, Higashiosaka (JP)

(73) Assignee: KYOCERA Corporation, Kyoto (JP)

( * ) Notice: Subject to any disclaimer, the term of this patent is extended or adjusted under 35 U.S.C. 154(b) by 151 days.

(21) Appl. No.: 13/819,678

(22) PCT Filed: Aug. 26, 2011

(86) PCT No.: PCT/JP2011/069259
§ 371 (c)(1),
(2), (4) Date: Feb. 27, 2013

(87) PCT Pub. No.: WO2012/026567
PCT Pub. Date: Mar. 1, 2012

(65) Prior Publication Data
US 2013/0155590 A1  Jun. 20, 2013

(30) Foreign Application Priority Data

Aug. 27, 2010 (JP) ................ 2010-191259
Aug. 27, 2010 (JP) ................ 2010-191261
Sep. 28, 2010 (JP) ................ 2010-216373
Oct. 12, 2010 (JP) ................ 2010-229683

(51) Int. Cl.
*H05K 7/00* (2006.01)
*H04M 1/02* (2006.01)
(Continued)

(52) U.S. Cl.
CPC ............ *H05K 7/00* (2013.01); *G06F 1/1624* (2013.01); *G06F 1/1643* (2013.01);
(Continued)

(58) Field of Classification Search
CPC . G06F 3/1423–3/1446; G06F 3/0484–3/0486; G06F 3/0488; G06F 1/1643; G06F 1/1647; G06F 1/1624; G06F 3/04886; G06F 3/04845; G06F 2203/04803; G09G 2300/023–2300/026; G09G 5/14; G09G 2340/10; G09G 2340/12; H05K 7/00; H04M 1/0245; H04M 1/0237; H04M 1/72544

USPC .............. 345/1.3, 4, 5, 173–178; 715/761
See application file for complete search history.

(56) References Cited

U.S. PATENT DOCUMENTS 6,466,202 B1  10/2002 Suso et al.
8,629,848 B2 *  1/2014 Tani et al. ............ 345/173
(Continued)

FOREIGN PATENT DOCUMENTS

JP  2002-044202 A  2/2002
JP  2004-145821 A  5/2004
(Continued)

OTHER PUBLICATIONS

PCT International Preliminary Report on Patentability (Translation to English) dated Mar. 19, 2013.*
(Continued)

*Primary Examiner* — Liliana Cerullo
(74) *Attorney, Agent, or Firm* — Procopio, Cory, Hargreaves & Savitch LLP

(57) ABSTRACT

A portable terminal device is provided which can improve the interest, functionality and additional value by display even when the two display modules are in the state of being overlapped. The portable terminal device includes a first unit which has a first display module, and is configured such that a user is allowed to see a side of the first unit opposite to a user's side through the first display module, a second unit which has a second display module, and a switching module and which is operable to switch the portable terminal device between a first configuration that the first unit covers the second display module, and a second configuration that the first unit is moved from the first configuration with respect to the second display module so that at least a part of the second display module is exposed to an outside.

6 Claims, 36 Drawing Sheets

(51) Int. Cl.
*G06F 3/0488* (2013.01)
*G06F 1/16* (2006.01)
*G06F 3/0484* (2013.01)
*G09G 5/14* (2006.01)
*G06F 3/14* (2006.01)
*H04M 1/725* (2006.01)

(52) U.S. Cl.
CPC ........... *G06F 1/1647* (2013.01); *G06F 3/0488* (2013.01); *G06F 3/04845* (2013.01); *G06F 3/04886* (2013.01); *G06F 3/1423* (2013.01); *G09G 5/14* (2013.01); *H04M 1/0237* (2013.01); *H04M 1/0245* (2013.01); *G06F 2203/04803* (2013.01); *G09G 2340/10* (2013.01); *G09G 2340/12* (2013.01); *H04M 1/72544* (2013.01); *H04M 1/72583* (2013.01); *H04M 2250/16* (2013.01); *H04M 2250/22* (2013.01)

(56) References Cited

U.S. PATENT DOCUMENTS

| | | | |
|---|---|---|---|
| 2006/0133047 | A1 | 6/2006 | Tomizuka et al. |
| 2006/0204137 | A1 | 9/2006 | Shimoda et al. |
| 2008/0256471 | A1 | 10/2008 | Okamoto |
| 2009/0179874 | A1 | 7/2009 | Watanabe |
| 2009/0295731 | A1* | 12/2009 | Kim et al. ............... 345/168 |
| 2012/0105487 | A1* | 5/2012 | Son et al. ............... 345/671 |

FOREIGN PATENT DOCUMENTS

| | | | |
|---|---|---|---|
| JP | 2004-163587 | A | 6/2004 |
| JP | 2006-171514 | A | 6/2006 |
| JP | 2006-215334 | A | 8/2006 |
| JP | 2006-244329 | A | 9/2006 |
| JP | 2008-083510 | A | 4/2008 |
| JP | 2008-257442 | A | 10/2008 |
| JP | 2008-299231 | A | 12/2008 |
| JP | 2009-048237 | A | 3/2009 |
| JP | 2009-171085 | A | 7/2009 |
| JP | 2009-171234 | A | 7/2009 |
| JP | 2000-253113 | A | 9/2009 |
| JP | 3162116 | U | 7/2010 |

OTHER PUBLICATIONS

International Search Report dated Nov. 15, 2011, issued for International Application No. PCT/2011/069259.
Notification of Reasons for Refusal dated Jul. 29, 2014 issued for counterpart Japanese application No. 2010-191261.
Notification of Reasons for Refusal dated Apr. 28, 2014, issued for counterpart Japanese application No. 2010-191261.
Notification of Reasons for Refusal dated Apr. 30, 2014, issued for counterpart Japanese application No. 2010-216373.
Notification of Reasons for Refusal dated May 20, 2014, issued for counterpart Japanese application No. 2010-191259.
International Preliminary Report on Patentability issued for International Application No. PCT/JP2011/069259, Feb. 27, 2013.

* cited by examiner

PORTABLE TERMINAL DEVICE

TECHNICAL FIELD

The present invention relates to a portable terminal device such as a cellular phone, a PDA (Personal Digital Assistant) and so forth.

BACKGROUND ART

Conventionally, a portable terminal device having two cabinets and each cabinet provided with a display surface is well known (for example, Patent Document 1). With this kind of portable terminal devices, when, for instance, two cabinets are overlapped each other, one display surface is exposed, and when two cabinets are arranged side by side, two display surfaces are exposed. Also, with this kind of portable terminal devices, a user can perform inputting on the display surfaces.

When two cabinets are overlapped each other, a device becomes compact and easy to carry. On the other hand, when the two cabinets are arranged side by side, a display area and input area are enlarged by the two display surfaces, and thus capabilities of looking, listening and operating on the display surfaces are improved.

SUMMARY OF INVENTION

Technical Problem

However, in the above construction, with a situation two cabinets are overlapped each other and being closed, the display surface of the bottom cabinet is completely covered by the top cabinet. Thus, in a closed condition, since displaying using two display surfaces cannot be performed, interest, functionality and additional value of a portable terminal device cannot be improved.

The present invention is done in light of the above technical problem, therefore the objection is to provide a portable terminal device which can improve the interest, functionality and additional value by display even when the two display surfaces are in the condition of being overlapped.

Solution to Problem

The portable terminal device of the present invention includes a first unit which has a first display module, and is configured such that a user is allowed to see a side of the first unit opposite to a user's side through the first display module, a second unit which has a second display module, and a switching module which is operable to switch the portable terminal device between a first configuration that the first unit covers the second display module, and a second configuration that the first unit is moved from the first configuration with respect to the second display module so that at least a part of the second display module is exposed to an outside.

Advantageous Effects of Invention

As the above, according to the present invention, it is possible to provide a portable terminal device which can improve the interest, functionality and additional value by display even when the two display modules are overlapped each other.

An advantage or significance of the present invention will become clearer from the description of embodiment, as shown below. However, the following description of embodiment is simply one illustration in embodying the present invention, and the present invention is not limited by what is described in the following description of embodiment.

Figure 1:
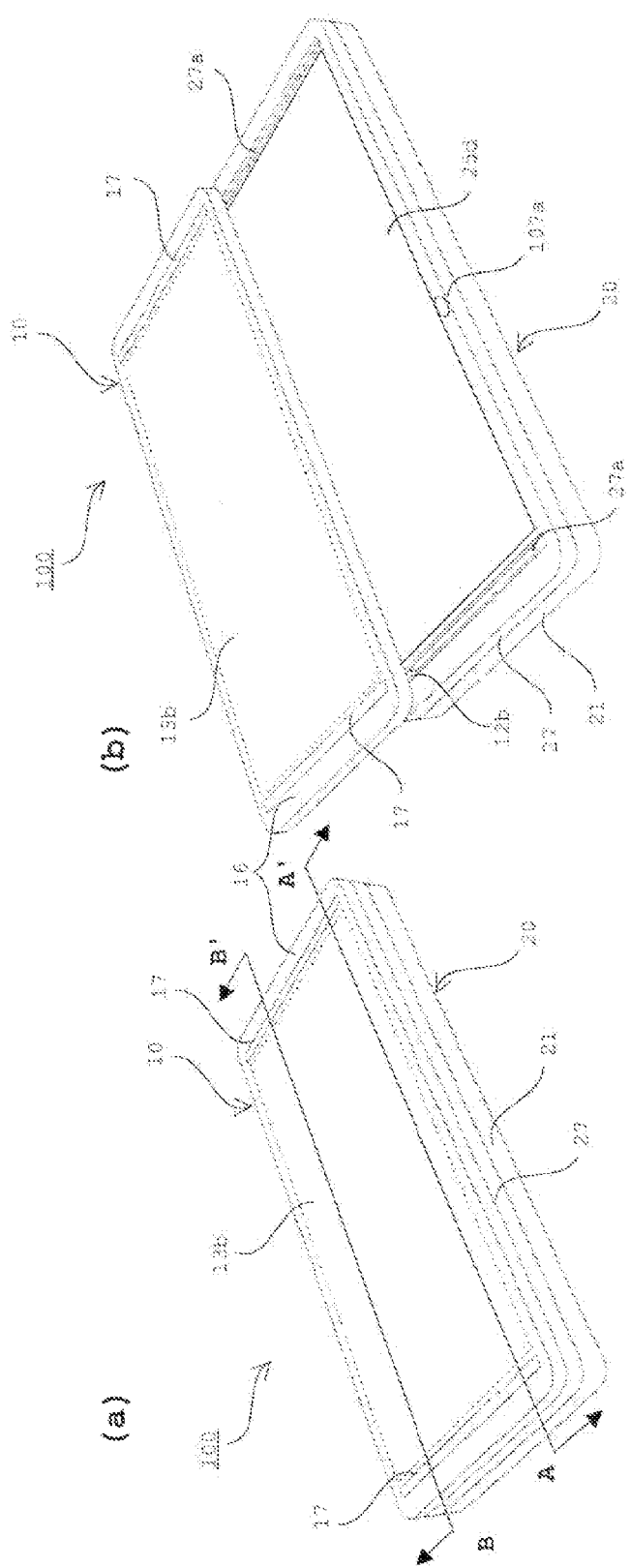
FIGS. 1(a) and 1(b) are diagrams showing a perspective overview of a portable terminal device according to an embodiment.

The drawings are entirely used for an explanation for an example of the embodiment, however, and not intended to limit a scope of the present invention.

DESCRIPTION OF EMBODIMENTS

In the following, a portable terminal device 100 according to the embodiments of the present invention will be described with reference to the drawings.

It is noted that, in the present embodiment, a sliding part 12 and a guiding hole 27a correspond to a "switching module" recited in a scope of the claims. A communication module 30 corresponds to an "information receiving module" recited in the scope of the claims. A "display control module" and an "extracting module" recited in the scope of the claims are realized as functions given to a CPU 23b by a controlling program stored in a memory 23c. It is noted that the description geared the above scope of the claims and the present embodiment is just one example, and it does not limit the scope of the claims to the present embodiment.

<First Embodiment>

Figure 2:
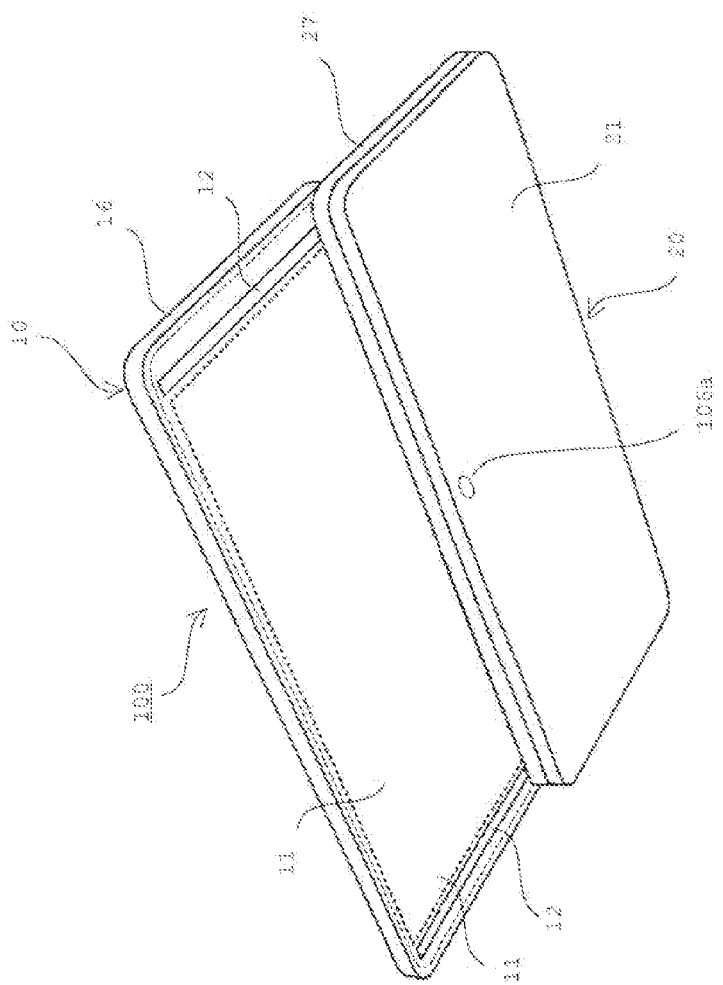
FIG. 2 is a diagram showing a perspective overview of the portable terminal device according to the embodiment.

FIG. 1(a) is a perspective view seen from a front side of a portable terminal device 100 showing a state that a first unit 10 is overlapped on a second unit 20. FIG. 1(b) is a perspective view seen from the front side of the portable terminal device 100 showing the state the first unit 10 and the second unit 20 are arranged side by side. FIG. 2 is a perspective view seen from a back side of the portable terminal device 100 showing the state the first unit 10 and the second unit 20 are arranged side by side. FIG. 3(a) is a cross-section view of FIG. 1(a) along the line A-A'. FIG. 3(b) is a cross-section view of FIG. 1(a) along the line B-B'. It is noted that, in the present embodiment, surfaces on which the display surface 16b and 27b are arranged are called front surfaces of the unit 10 and 20, respectively, and the surfaces opposing the front surfaces are called back surfaces of the unit 10 and 20.

The portable terminal device 100 is a portable computer having Near Field Communication functions, such as a mobile phone, PDA, portable game machine, etc. The portable terminal device 100 provides the first unit 10 and the second unit 20.

The first unit 10 is overlapped on the second unit 20, and the first unit 10 is slidable against the second unit 20. The first unit 10 provides a first bottom part 11.

The first bottom part 11 has a rectangle shape, is made from transparent resin, such as polycarbonate, acrylic, etc., and formed by mold injection. The first bottom part 11 is provided with two bottom through holes 11a spacing each other. The bottom through holes 11a are long and narrow, and stretched out to a direction where the first unit 10 slides into. Sliding parts 12 are attached to the bottom through holes 11a respectively.

The sliding part 12 has a main body part with a slender member. The main body part is attached to the bottom through holes 11a, and arranged above a second lid part 27 described below. The sliding part 12 has an insertion hole 12a at the intermediate portion of the main body part, and has a locking part 12b at the end of the main body part. The locking part 12b projects inward into the second lid part 27 through the bottom through hole 11a and a guiding hole 27a described later. On the locking part 12b, a through hole 12c is formed. The through hole 12c goes through the side surface of the locking part 12b from top surface of the main body part, and connects the inside of the first unit 10 and the inside of the second unit 20. Between two sliding parts 12, on the first bottom part 11, the first display module 13 is arranged.

The first display module 13 is a flat plate with a rectangle shape, and for example, is constructed of a transparent liquid crystal display instrument. The liquid crystal display instrument includes a liquid crystal panel, however a backlight is not arranged behind the liquid crystal panel. A display mode of the liquid crystal panel is normally white. The liquid crystal panel is constructed by sandwiching transparent liquid crystal (not illustrated) and transparent electrodes (not illustrated) between two transparent plates (not illustrated). An electrode 13a is provided at the edge of the first display module 13, and the first input module 14 is overlapped on the first display module 13.

The electrode 13a connects the transparent liquid crystal display instrument and a wiring 15. A flexible substrate is used for the wiring 15. The wiring 15 passes through the through hole 12c of the locking part 12b and enter into the second lid part 27.

For the first input module 14, a touch sensor and so on are used to detect whether a user touched the surface and to detect where the user touched. The touch sensor is a transparent rectangular sheet and two transparent electrodes (not illustrated) are incorporated in the touch sensor in matrix state. A wiring of the first input module 14 is, as the same with the wiring 15 of the first display module 13, guided into the second lid part 27 through the through hole 12c of the locking part 12b.

The first lid part 16 is put on top of the first bottom part 11 so as to cover the first input module 14. The first lid part 16 is made from the transparent resin, such as polycarbonate, acrylic, etc., and formed by mold injection. On the first lid part 16, a first display surface 16b is formed. The first display surface 16b covers the first display module 13 and is arranged on a range where an area overlapping with the first display module 13 and the second display module 25. Also, the first lid part 16 provides two lid through holes 16a. The lid through holes 16a are provided on top of the bottom through hole 11a, and cover parts 17 are attached on the lid through holes 16a respectively.

The cover part 17 is made from opaque resin and formed by mold injection. The cover part 17 covers with the sliding part 12 stored in the bottom through hole 11a. The cover part 17 is provided with a screw hole 17a. By putting a screw 18 in the screw hole 17a and the insertion hole 12a of the sliding part 12, the sliding part 12 and the cover part 17 are connected lengthwise.

By being connected the sliding part 12 and the cover part 17, the first lid part 16 and the first bottom part 11 are fixed, and then the first unit 10 is assembled.

The second unit 20 is provided with a second bottom part 21. The second bottom part 21 is rectangle, and the size is almost the same with the first lid part 16. Inside the second bottom part 21, holding parts 21a are provided. The holding part 21a is elongated protrusion, and the holding part 21a stretches out to the direction where the first unit 10 slides to. Receiving parts 26 are arranged on the holding parts 21a respectively.

The receiving part 26 has a bottom plate and a side plate, and the receiving part 26 stretches out to the direction where the first unit 10 slides to. The receiving part 26 is arranged under the guiding hole 27a, and is attached to the locking part 12b protruded from the guiding hole 27a.

A battery 22 is arranged inside the second bottom part 21, and a substrate 23 is superimposed over the battery 22. On the surface of the substrate 23, a connector 23a and electronic components (not illustrated), such as a CPU and a memory, are arranged. Between the connector 23a and the electric components is connected by a wiring (not illustrated). Also, the connector 22a is provided next to the battery 22. The connector 22a is connected to the substrate 23 and the battery 22, and also is connected to the wiring 15 of the first display module 13 and the wiring of the first input module 14. The second display module 25 is superimposed on the substrate 23.

The second display module 25 is, for example, constructed of a non-transparent liquid crystal display instrument. The liquid crystal display instrument has a liquid crystal panel 25a and an illuminating part for illuminating the liquid crystal panel 25a. The liquid crystal panel 25a is constructed by sandwiching transparent liquid crystal (not illustrated) and transparent electrodes (not illustrated) between two transparent plates (not illustrated). The illuminating part includes a light guide plate 25b and a light emitting part 25c. The light guide plate 25b is arranged next to the light emitting part 25c and under the liquid crystal panel 25a so as to guide the light from the light emitting part 25c to the second display module 25. A second input module 24 is superimposed over the liquid crystal panel 25a.

The second input module 24 provides, for example, a touch sensor. The touch sensor is a transparent sheet of a rectangular shape. Two transparent electrodes (not illustrated) are incorporated in the touch sensor in matrix state, and a wiring (not illustrated) is connected to the transparent electrodes.

The light emitting part 25c, the liquid crystal panel 25a and the second input module 24 are arranged with wirings (not illustrated) respectively, and these wirings are connected to the substrate 23.

The second lid part 27 is connected to the second bottom part 21 and forms the second unit 20. In the middle of the second lid part 27, a transparent display window is formed. The display window is the second display surface 27b, covers the second display module 25, and is positioned at the same range as the second display module 25. Also, the second lid part 27 is provided with two guiding holes 27a spacing each other. Since the locking part 12b passes through the guiding hole 27a, the locking part 12b is locked at the edge of the second lid part 27 which surrounds the guiding hole 27a, therefore the first unit 10 and the second unit 20 are connected.

FIG. 4(a) is a perspective view showing the wiring 15 when the first unit 10 and the second unit 20 are overlapped. FIG. 4(b) is a perspective view showing the wiring 15 when the first unit 10 and the second unit 20 are aligned. It is noted that in FIGS. 4(a) and (b), to show the wiring 15 clearly and simply, a part of the components such as the first lid part 16 is illustrated with dashed lines.

As in FIG. 1(a), when the portable terminal device 100 is folded, and the first unit 10 and the second unit 20 are overlapped to each other, the first display surface 16b is shown outside, and the second display surface 27b is hidden under the first unit 10. From now on, this state of the portable terminal device 100 is called closed state, and the display configuration is called the first configuration.

In the first configuration, as shown in FIG. 4(a), the locking part 12b of the sliding part 12 is located at one edge of the guiding hole 27a, that is, near the connector 23a of the substrate 23. The wiring 15 stretches from the through hole 12c of the locking part 12b along the receiving part 26, and along the way, bends to return toward the through hole 12c along the receiving part 26, then connects to the connector 23a.

On the other hand, as shown in FIG. 1(b), when the portable terminal device 100 is opened up, and the first unit 10 is pulled out to the side of the second unit 20, both the first display surface 16b and the second display surface 27b are shown exteriorly. At this time, an end of the first unit 10 is slightly overlapping the end of the second display surface 27b, and the first display surface 16b and the second display surface 27b are aligned side by side with no gap between them. Hereinafter, this state of the portable terminal device 100 is open state, and this display configuration is called the second configuration.

In the second configuration, as shown in FIG. 4(b), the locking part 12b of the sliding part 12 moves from one end to the other end of the guiding hole 27a, and the guiding hole 27a opens. The locking part 12b moves away from a position of the connector 23a of the substrate 23, and the wiring 15 extends from the through hole 12c of the locking part 12b to the connector 23a of the substrate 23 linearly.

It is noted that by switching between the first configuration and the second configuration, the second unit 20 moves between the first position that the second unit 20 superimposes over the first unit 10 in the first configuration and the second position that the second unit 20 aligns with the first unit 10 in the second configuration.

Figure 5:
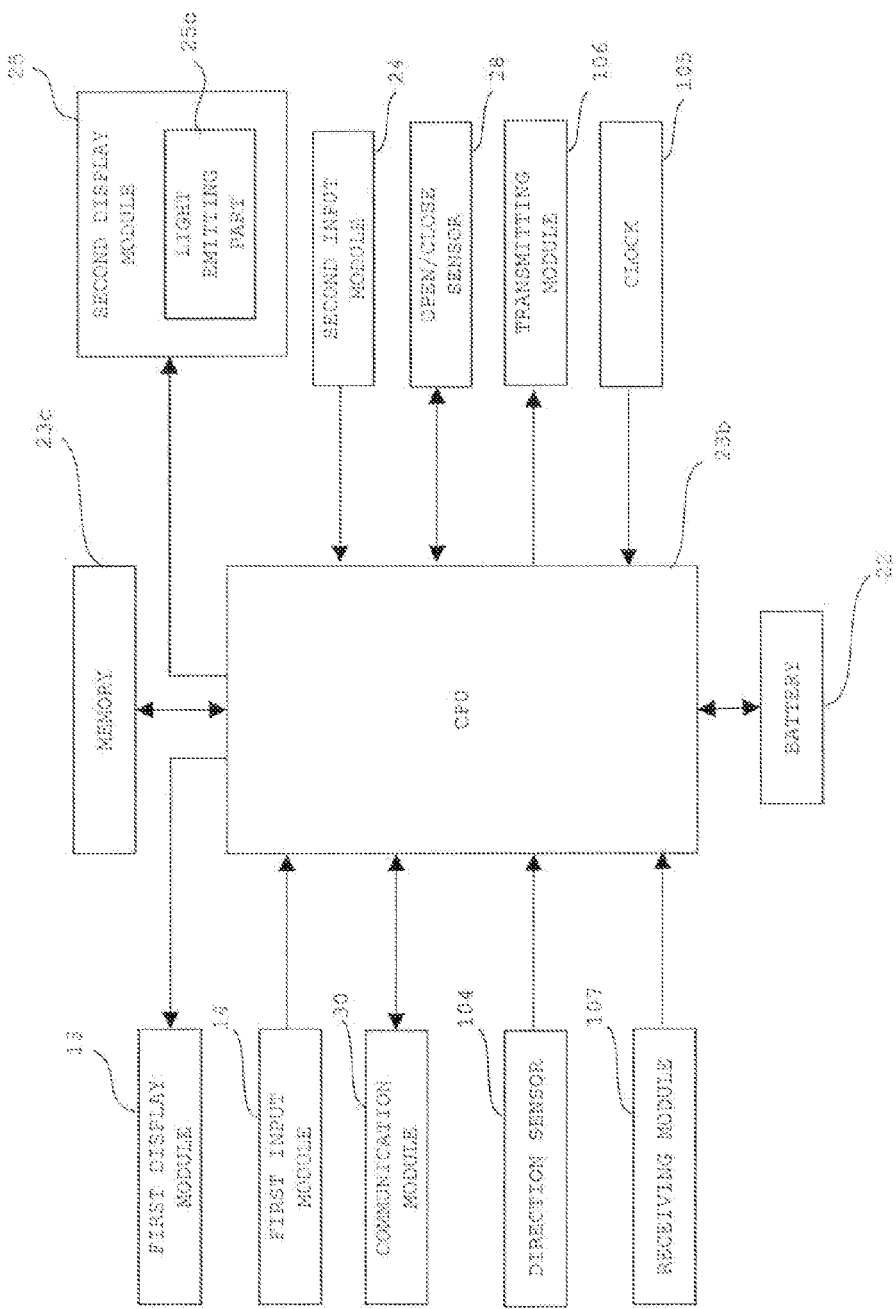
FIG. 5 is a block diagram showing a circuit of the portable terminal device according to the embodiment.

FIG. 5 is a block diagram showing a circuit of the portable terminal device 100.

The portable terminal device 100 of the present embodiment comprises a CPU 23b, a memory 23c, a communication module 30, an open/close sensor 28, a direction sensor 104, a clock 105, a transmitting module 106 and a receiving module 107 other than the above components.

The first display module 13 and the second display module 25 receive image signals from the CPU 23b. By impressing a voltage to the transparent electrodes of the display module 13 and 25 based on these image signals, orientation of the liquid crystal is changed, and the light passing the liquid crystal is modulated. This allows the display module 13 and 25 to display images, such as figures, e.g. icons, keyboard, etc., pictures, letters, drawings and windows. The images displayed by the first display module 13 are shown on the first display surface 16b of the first lid part 16 through the transparent first input module 14. The images displayed by the second display module 25 are shown on the second display surface 27b of the second lid part 27 through the transparent second input module 24. However, in the first configuration, if the first display module 13 is transparent, the images displayed by the second display module 25 are shown on the first display surface 16b through the transparent first display module 13. For this reason, on the first display surface 16b, images from the first display module 13 or the images from the second display module 25 are displayed.

Also, in the first display module 13, in a range where the voltage is not applied, transmittance becomes maximum and the light is transmissive. Then, since the first lid part 16, first input module 14 and first bottom part 11 which sandwich the first display module 13 are transparent, a range where the light transmits in the first display module 13 is transparent or translucent, and the range is see through that a scenery behind the first display module 13 can be seen.

Electricity is supplied to the light emitting part 25c of the second display module 25 from the battery 22 according to a control signal from the CPU 23b. As a result, the light emitting part 25c emits light. The emitted light enters into the light guiding plate 25b from the side surface of the light guiding plate 25b, and while the light is reflecting inside the light guiding plate 25b, a part of the light comes out from the surface of the light guiding plate 25b to the liquid crystal panel 25a side. As a result, the light is emitted evenly from all over the light guiding plate 25b, and the light is irradiated onto the liquid crystal panel 25a. This makes the image displayed on the second display surface 27b visible. It is noted that, the emitting part is not provided on the first display module 13, the liquid crystal panel of the first display module 13 is illuminated by the light from outside in the first configuration, and is illuminated by the light from the second display module 25 in the second configuration. This makes the image displayed on the first display surface 16b visible.

The first input module 14 detects changes of capacitance between the transparent electrodes. Because of this, when the capacitance is changed at a position where a user's finger, etc., touched on the first display surface 16b, the first input module 14 outputs a signal according to the touched position by the user to the CPU 23b. As a result, the position shown by the user on the first display surface 16b can be detected. It is noted that, in the second configuration, since the image displayed by the first display module 13 is shown on the first display surface 16b, the first input module 14 detects the position shown by the image of the first display module 13. In the first configuration, when the image from the first display module 13 is displayed on the first display surface 16b, the first input module 14 detects the position shown against the image by the first display module 13. On the other hand, in the first configuration, when the first display module 13 is transparent, and the image by the second display module 25 is shown on the first display surface 16b, the first input module 14 detects the position shown against the image by the second display module 25.

The second input module 24 outputs a signal according to the position touched by a user's finger, etc., on the second display surface 27b, as the same with the first input module 14, to the CPU 23b. As a result, the position shown by the user on the second display surface 27b can be detected. It is noted that, in both the first configuration and the second configuration, since the image displayed by the second display module 25 is shown on the second display surface 27b, the second input module 24 detects the position shown on the image of the second display module 25.

The battery 22 supplies electricity to the CPU 23b, the display modules 13, 25, the input modules 14 and 24, etc., according to the control signal from the CPU 23b.

The memory 23c is a memory module including ROM and RAM. In the memory 23c, a control program to grant a control function to the CPU 23b is stored. For example, the memory 23c stores the control program to convert information to a signal for Near Field Communication according to the standards of the Near Field Communication. Besides, in the memory 23c, text information, image information and acoustic information are stored in predetermined file forms. For instance, they are image information of photos and videos taken by a camera module (not illustrated), e-mail information of image information and text information, etc. downloaded from outside via communication module 30, contact information, etc. of names, telephone numbers, e-mail addresses, and so on. Further, in memory 23C, images such as icons displayed on display surfaces 16b and 27b and positions where these images are located are associated with each other and stored.

An Open/close sensor 28 is arranged at a position near a magnet in first configuration, and the magnet is arranged near the locking part 12b. The open/close sensor 28 is connected to substrate 23 by a wiring and between the open/close sensor 28 and the CPU 23b on the substrate 23, signals are transmitted and received. In the first configuration, when the magnet exists near the open/close sensor 28, the open/close sensor 28 detects a magnetic field, and outputs a detection signal of close to the CPU 23b. On the contrary, in the second configuration, when the magnet is located far from the open/close sensor 28, the open/close sensor 28 does not detect the magnetic field, nor outputs the detection signal of close to the CPU 23b.

The communication module 30 converts an audio signal, an image signal and a text signal from the CPU 23b into radio signals and transmits the radio signals to a base station via an antenna. Also, the communication module 30 converts the received radio signals into the audio signal, the image signal, the text signal and so on and outputs these signals to the CPU 23b.

For direction sensor 104, a geomagnetic sensor, etc., is used. The direction sensor 104 detects the direction each display module, 13 and 25, is facing, and outputs a signal according to the directions to the CPU 23b.

Clock 105 measures time, and outputs a signal according to the time measured to the CPU 23b.

The transmitting module 106 has a generating part (not illustrated) which generates electromagnetic waves and transmitting window 106a which emits the electromagnetic waves to the exterior. The transmitting module 106 receives the control signal from the CPU 23b, generates a signal by modulating the electromagnetic waves from the generating part based on the control signals, and emits the signal from the transmitting window 106a. This makes the information be transmitted to a receiving side terminal by the Near Field Communication. It is noted that, as the Near Field Communication, a method to transmit/receive information between the receiving side terminal existing a short distance away using electromagnetic waves, such as infrared communication and Bluetooth (registered trademark), is used. Also, the transmitting window 106a is provided on a back surface of the second unit 20 as shown in FIG. 2. As a result, the electromagnetic waves are irradiated to the front of the back surface of the second unit 20. This transmitting window 106a is provided at the position near the first unit 10 on the back surface of the second unit 20 of the portable terminal device 100 in the second configuration. Further, the transmitting window 106a is provided at the position in the center or near the center of a range that the first unit 10 and the second unit 20 put together.

A receiving module 107 has a receiving window 107a and a receiving part (not illustrated) receiving the electromagnetic waves which passed the receiving window 107a. The receiving module 107 detects the modulated electromagnetic waves, converts a detection signal of the electromagnetic waves into an electric signal and outputs the electric signal to the CPU 23b. This obtains the information from the receiving side terminal by the Near Field Communication. It is noted that, the receiving window 107a is provided to the front of the second unit 20 as shown in FIG. 1(b). For this reason, the receiving module 107 detects the electromagnetic waves irradiated from the front of the front surface of the second unit 20.

As a display control module to control the display module, the CPU 23b has each display module, 13 and 25, display images, sets the first display module 13 to be in a see through state, or lets an illumination of the second display module 25 to be lit.

That is, the CPU 23b obtains text information and image information by reading the information out from the memory 23c and by receiving the information through the communication module 30. The CPU 23b outputs the information as image signals to the first display module 13 and the second display module 25, respectively, and have each display surface, 16b and 27b, display the images.

Also, the CPU 23b controls a voltage impressed to a transparent electrodes by outputting the control signal to adjust electricity provided from the battery 22 to the first display module 13 and changes transmittance of the first display module 13. This makes the CPU 23b set the display area other than the image displayed by the first display module 13 in a see through state.

Further, when the image is displayed on the second display module 25, the CPU 23b makes the battery 22 supply electricity to the light emitting part 25c and makes the light emitting part 25c emit light.

The CPU 23b generates the control signal to convert information into the Near Field Communication signal according to the communication standards of the Near Field Communication and outputs the control signal to the transmitting module 106. Also, the CPU 23b, according to the communication standards of the Near Field Communication, receives electric signals from the receiving module 107, converts the electric signal into information, and stores the information in the memory 23c.

Figure 6:
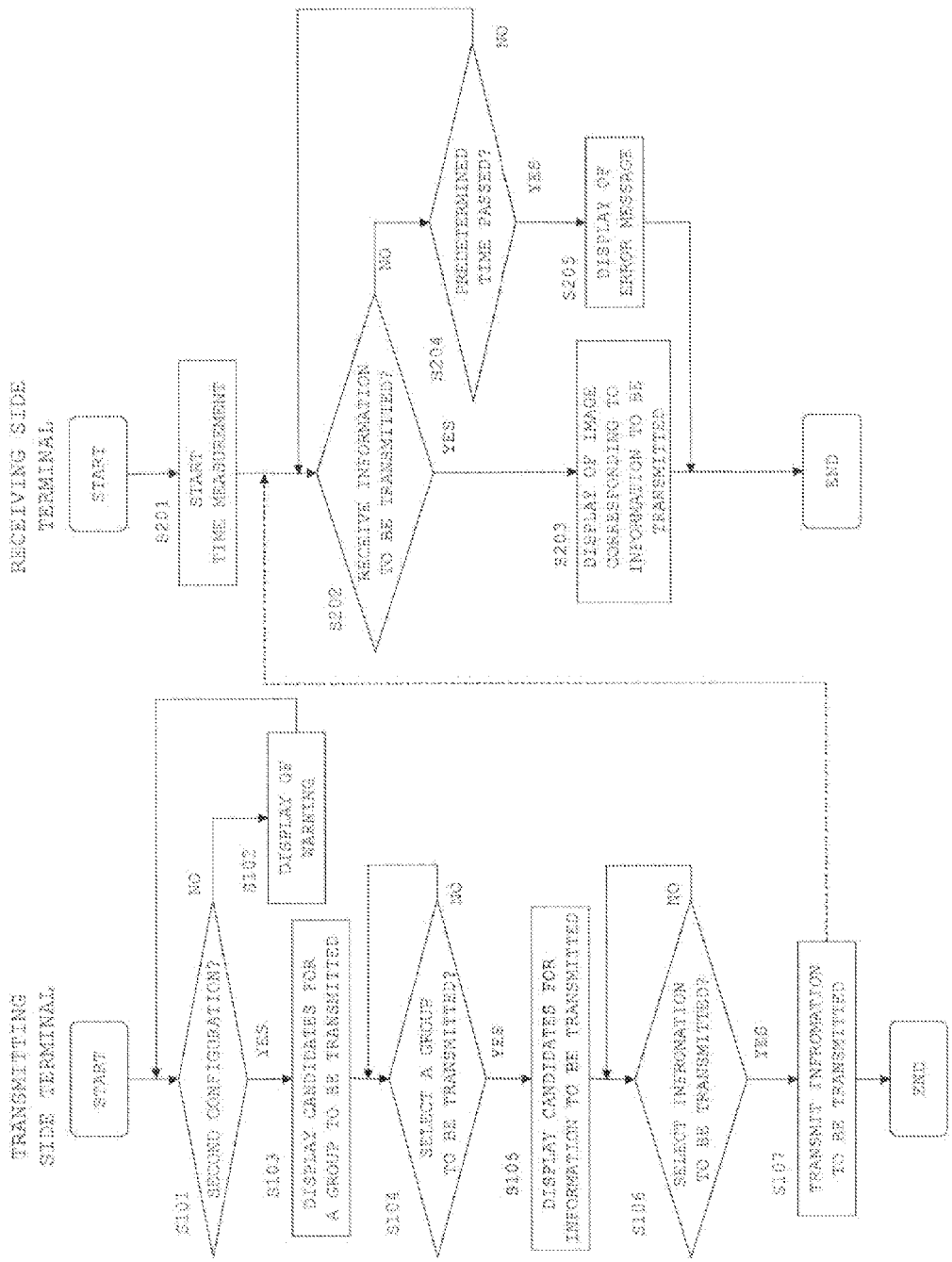
FIG. 6 is a flow chart showing a procedure for processing to transmit and to receive information via infrared communication according to the embodiment.
Figure 7:
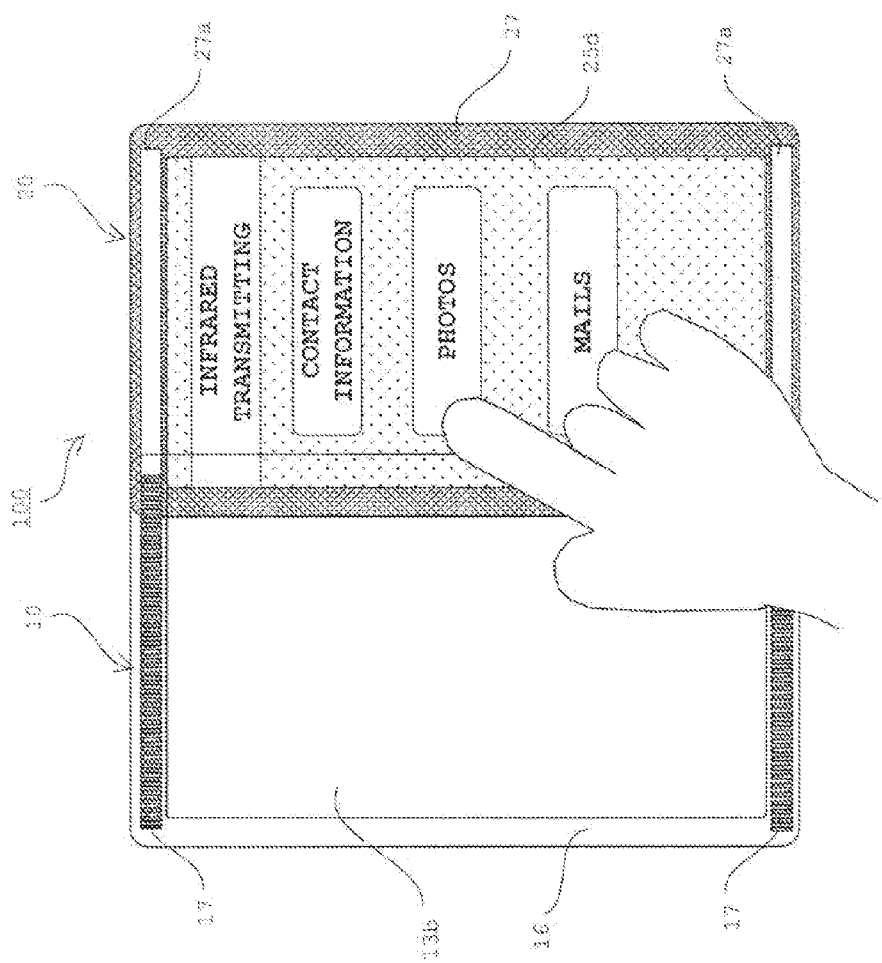
FIG. 7 is a diagram showing an image for selecting transmitting information via infrared communication on a second display surface of a transmitting side terminal according to the embodiment.
Figure 8:
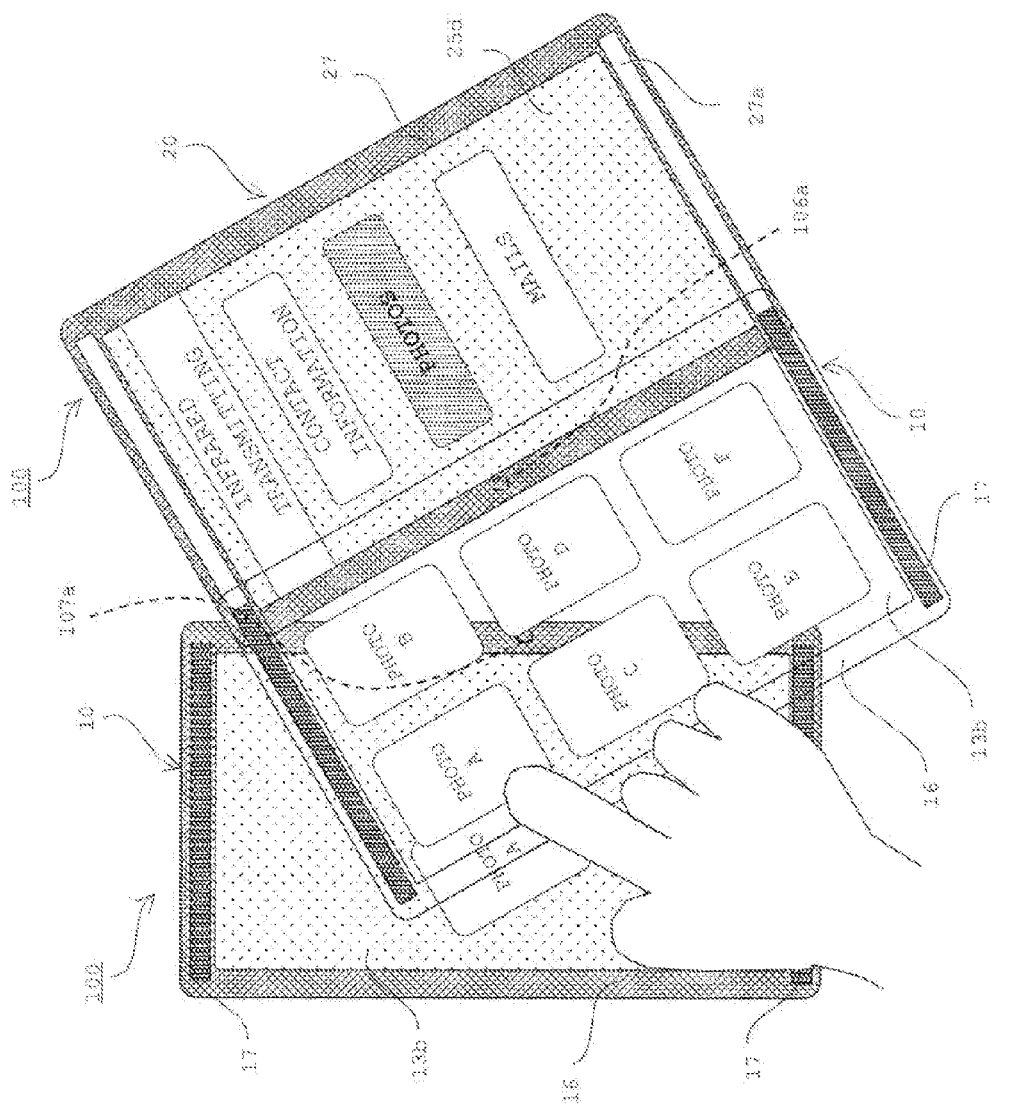
FIG. 8 is a diagram explaining a state of transmitting the information from the transmitting side terminal to a receiving side terminal according to the embodiment.

FIG. 6 is a flow chart showing a procedure for processing of the portable terminal device 100 (hereinafter, referred to as a transmitting side terminal) which transmits information via infrared communication and a procedure for processing of the portable terminal device 100 (hereinafter, referred to as a receiving side terminal) which receives information via infrared communication. FIG. 7 shows the transmitting side terminal displaying images on the second display surface 25d to select transmitting information via infrared communication. FIG. 8 shows a state when the transmitting side terminal transmitted the information to the receiving side terminal.

In the transmitting side terminal, an operation menu is displayed on the first display surface 13b or the second display surface 25b. When a user touches a position of an icon for infrared transmitting among the operation menu, a function to transmit information via infrared communication is selected, and a control program for infrared transmitting function is activated.

First, the CPU 23b determines whether the transmitting side terminal is in the second configuration or not (S101). However, if a detection signal of closed from the open/close sensor 28 is input, the CPU 23b determines that the transmitting side terminal is in the state of closed, this display configuration is the first configuration, and it is not the second configuration (S101: NO). Then, the CPU 23b reads predetermined warning information from the memory 23c, and the warning such as "please open the portable terminal device" is displayed on the first display surface 13b. With the warning, the user is prompted to have the transmitting side terminal to be in the second configuration.

On the other hand, the detection signal of closed from the open/close sensor 28 is not input, the CPU 23b determines that the transmitting side terminal is in the open state and this display configuration is in the second configuration (S101: YES). As such, by making the transmitting side terminal be in the second configuration, since the first unit 10 is not superimposed over anything, from a transparent range of the first unit 10, a scenery behind can be seen.

Next, as shown in FIG. 7, the CPU 23b displays candidates of groups to be transmitted to the second display surface 25d (S103). The groups to be transmitted are information capable of being transmitted and divided into different kinds, such as contact information, photos and e-mails, etc., among the information stored in the memory 23c.

The CPU 23b waits for a group to be selected among the candidate groups to be transmitted of the second display 25d (S104). In this second display surface 25d, for example, the position of the "photos" is detected, the CPU 23b determines that the "photos" group to be transmitted is selected (S104: YES).

Next, the CPU 23b reads out image information A-F of photos from the memory 23c, and as shown in FIG. 8, the photos A-F are displayed on the first display surface 13b as candidates of information to be transmitted (S105). At this time, since the images of the photos A-F are shown as thumbnails, the content of the images is easily understood. Also, in the first display surface 13b, the display area other than the images of the photos A-F is set as see through state. For this reason, when the first unit 10 of the transmitting side terminal is held over the receiving side terminal which is a destination the user wants to forward the image, the user can see the receiving terminal behind the first unit 10 via the display area which is being a see through state.

A user touches the image of the photo A disposed on the first display surface 13b with a predetermined action, while the transmitting side terminal is disposed on a position where the receiving side terminal can be seen through the first display surface 13b. This makes the CPU 23b determine that the photo A on the position touched is selected as information to be transmitted (S106: YES). It is noted that, the predetermined action, for example, can be touching the display position of the information to be transmitted twice in a row without a break, drawing a circle while touching the display position of the information to be transmitted, etc. Such actions to select the information to be transmitted are different from other actions to select other information, therefore different information is transmitted by mistake would be prevented. Besides, as shown in FIG. 8, the second display surface 25d displays the candidates for the group to be transmitted.

Then, the CPU 23b reads out the information of the image A corresponding to the image of the selected photo A from the memory 23c, converts the information of the photo A into an infrared signal, and transmits the infrared signal from the transmitting module 106 (S107). As a result, infrared light is emitted from the transmitting window 106a provided on the back surface of the second unit 20 to the receiving side terminal located on the back of the first unit 10. It is note that, the information of the photo A includes attached information showing the display state in the transmitting side terminal in addition to the image information of the photo A. Attached information may be the information showing which form, such as a thumbnail, file name, icon, etc., the photo A is displayed, the display size information of the photo A on the first display surface 13b, and the direction information the photo A is displayed, and so on. The direction photo A is displayed can be figured out from the direction of the first display surface 13b detected by the direction sensor 104.

In contrast, in the receiving side terminal, an operation menu is displayed on the first display surface 13a or the second display surface 25d. When a user touches the position of an infrared ray receiving icon among the operation menu, a function to receive information by infrared communication is selected, and a control program for the infrared receiving function is activated.

The CPU 23b receives a signal from the clock 105, and then starts to measure passed time (S201).

The receiving module 107 receives infrared ray irradiated from the front of the front surface of the second unit 20. In this case, the front surface of the second unit 20 of the receiving side terminal is facing to the back surface of the second unit 20 of the transmitting side terminal. For this reason, the infrared ray emitted from the transmitting module 106 on the back surface of the second unit 20 of the transmitting side terminal is received by the receiving module 107 on the front surface of the second unit 20 of the receiving side terminal.

The CPU 23b determines whether or not the information, in this case, the information of the photo A, has been received or not (S202). Then, when the receiving module 107 detects the infrared ray, the CPU 23b receives a detection signal of the infrared ray from the receiving module 107. The CPU 23b determines that the image of the photo A is received if the detection signal of the infrared ray from the receiving module 107 can be converted into the information of the photo A, according to the communication standards of the Near Field Communication (S201: YES).

The CPU 23b extracts image information and attached information from the obtained information of the photo A. While the CPU 23b generates the image of the photo A from the image information, the CPU 23b obtains a display state, a display size and a display direction of the image of the photo A at the transmitting side terminal from the attached information. The CPU 23b displays the image of the photo A on the first display surface 13b of the receiving side terminal with the same display state, display size and display direction as in the transmitting side terminal (S203).

On the other hand, when the receiving module 107 cannot receive a part or all of the signal of the infrared ray related to the information of the photo A, and the CPU 23b cannot convert the detection signal of the infrared ray into the information of the photo A, the CPU 23b determines that it did not receive the image of the photo A (S202: NO).

The CPU 23b determines whether the measured time has passed the predetermined time or not (S204). Here, when the measured time has passed the predetermined time, the CPU 23b determines again whether or not all of the infrared signal related to the image of the picture A has already been received by the receiving module 107 or not. On the other hand, when the measured time passed the predetermined time, predetermined error message information is read out from the memory 23c and being displayed on the second display surface 25d.

As described above, according to the embodiment, while the information to be transmitted is displayed on the first display surface 13b, a display area other than the information to be transmitted is displayed is set to be a see through state. As a result, the user can see the receiving side terminal that is a destination of the infrared communication through the image corresponding to the information to be transmitted via the display area in a see through state. The user can obtain a sense of sending out the targeted information toward the receiving side terminal the user sees through the image. This makes the user feel interested.

Further, according to the embodiment, information of the picture A (the information to be transmitted) includes image information and display information in the transmitting side terminal. For this reason, also in the receiving side terminal, the image of the picture A can be displayed on the display surface with the same display state with the transmitting side terminal. Thus, it looks as if the image of the picture A flew from the transmitting side terminal to the receiving side terminal. Thus, the user finds the Near Field Communication more interesting.

Also, according to the embodiment, the transmitting module 106 is provided on the back surface of the second unit 20, and the receiving module 107 is provided on the front surface of the second unit 20. For this reason, the user only needs to place the transmitting side terminal to where the receiving side terminal can be seen via the display area in a see through state because it makes the transmitting module 106 and receiving module 107 be arranged in a position they face to each other automatically. Therefore, the user does not need to worry about positional relationship between the transmitting module 106 and the receiving module 107. Especially, for those users who do not know the position of a communication port, there is no need to look for the positions of the transmitting module 106 and the receiving module 107 and match up these two, therefore the user can easily match up the positions of the transmitting module 106 and the receiving module 107.

Further, according to the present embodiment, the transmitting window 106a is provided at the center or near the center of the range of where the first unit 10 and the second unit 20 are put together. For this reason, even if the direction of the display surfaces 13b and 27b are rotated to axes vertical to the display surface 13b and 25d, the position of the transmitting window 106a hardly changes. Therefore, the direction of the portable terminal device 100 can be change freely.

<Modification Example>

The embodiment of the present invention has been described above, but the present invention is not limited to the above embodiment, and the embodiment of the present invention may be variously modified.

According to the above first embodiment, the transmitting module 106 and receiving module 107 are provided on the second unit 20, however, the transmitting module 106 and the receiving module 107 can be provided on the first unit 10.

Also, in the above first embodiment, the same portable terminal device 100 was used for a receiving side terminal as with the portable terminal device 100 for a transmitting side. However, computers with the Near Field Communication function, such as a personal computer, etc., can also be used.

Further, in the above first embodiment, the target information to be transmitted was displayed with thumbnail form image, however the display state of the information to be transmitted is not limited to this state, and any state of images corresponding to the information to be transmitted can be used. For example, the CPU 23b can extract file names from the information to be transmitted, and images showing the file names can be displayed on the first display module 13. Besides, the CPU 23b can extract a file form from the information to be transmitted, and icons corresponding to the file form can be displayed on the first display module 13.

Also, according to the above first embodiment, as shown in FIG. 8, in the transmitting side terminal, when the image of the photo A is touched and selected as information to be transmitted, candidates of a group to be transmitted is displayed on the second display surface 25d. In contrast, a contents displayed on the second display surface 25d is not limited to this contents. For example, the CPU 23b can enlarge and display the image of the photo A on the second display surface 25d. Further, with the enlarged and displayed image of the photo A, detailed information of the photo A can be displayed on the second display surface 25d. The detailed information of the photo A may include shooting dates, places, image points, etc. As such, since the information related to the photo A, such as the image enlarged and displayed and detailed information, etc., is displayed on the second display surface 25, the user can learn about the image to be transmitted more concretely.

Also, in the first embodiment, display information such as display sizes and display directions is attached to the image information of the information of the photo A, however such information does not need to be attached. Or, the display information can include positional information of the transmitting side terminal and the display position information of the image of the photo A at the transmitting side terminal. In this case, from positional information of the transmitting side terminal and the positional information of the receiving side terminal, relative position between the transmitting side terminal and the receiving side terminal can be obtained. From this relative position and the display position of the photo A in the transmitting side terminal, the display position of the photo A displayed on the receiving side terminal is obtained.

Also, according to the above first embodiment, a notification showing whether the receiving side terminal received the information or not can be transmitted to the transmitting side terminal. For this reason, the transmitting side terminal can tell whether the information was successfully transmitted or not.

Furthermore, the first embodiment of the present invention may be modified variously and suitably within the scope of the technical idea described in claims.

It is noted that, in the first embodiment, by realizing the Near Field Communication, which a user can find it interesting, the interest, functionality and additional value in the portable terminal devices are improved.

<Second Embodiment>

Figure 3:
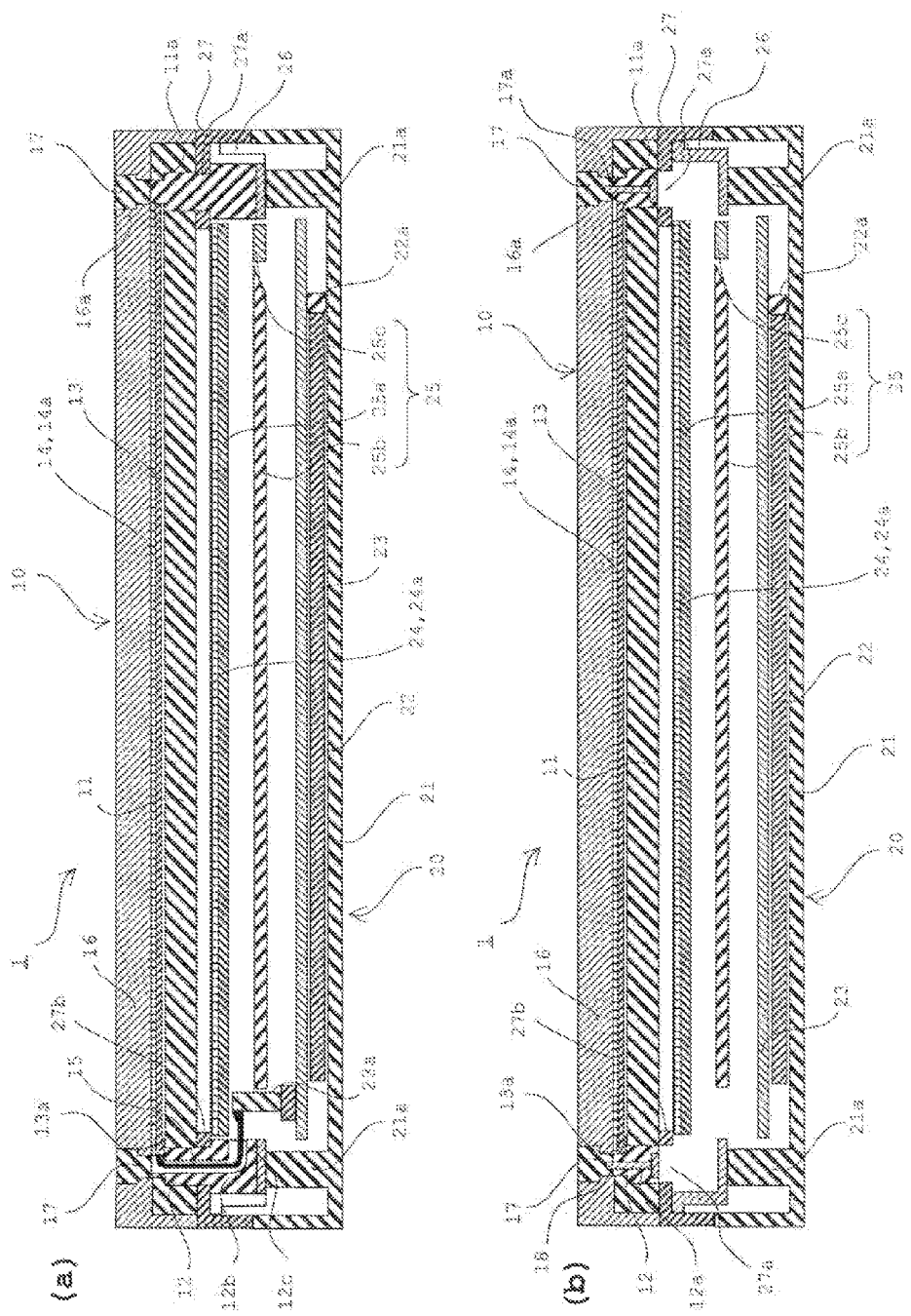
FIGS. 3(a) and 3(b) are diagrams showing cross-section views of the portable terminal device according to the embodiment.
Figure 4:
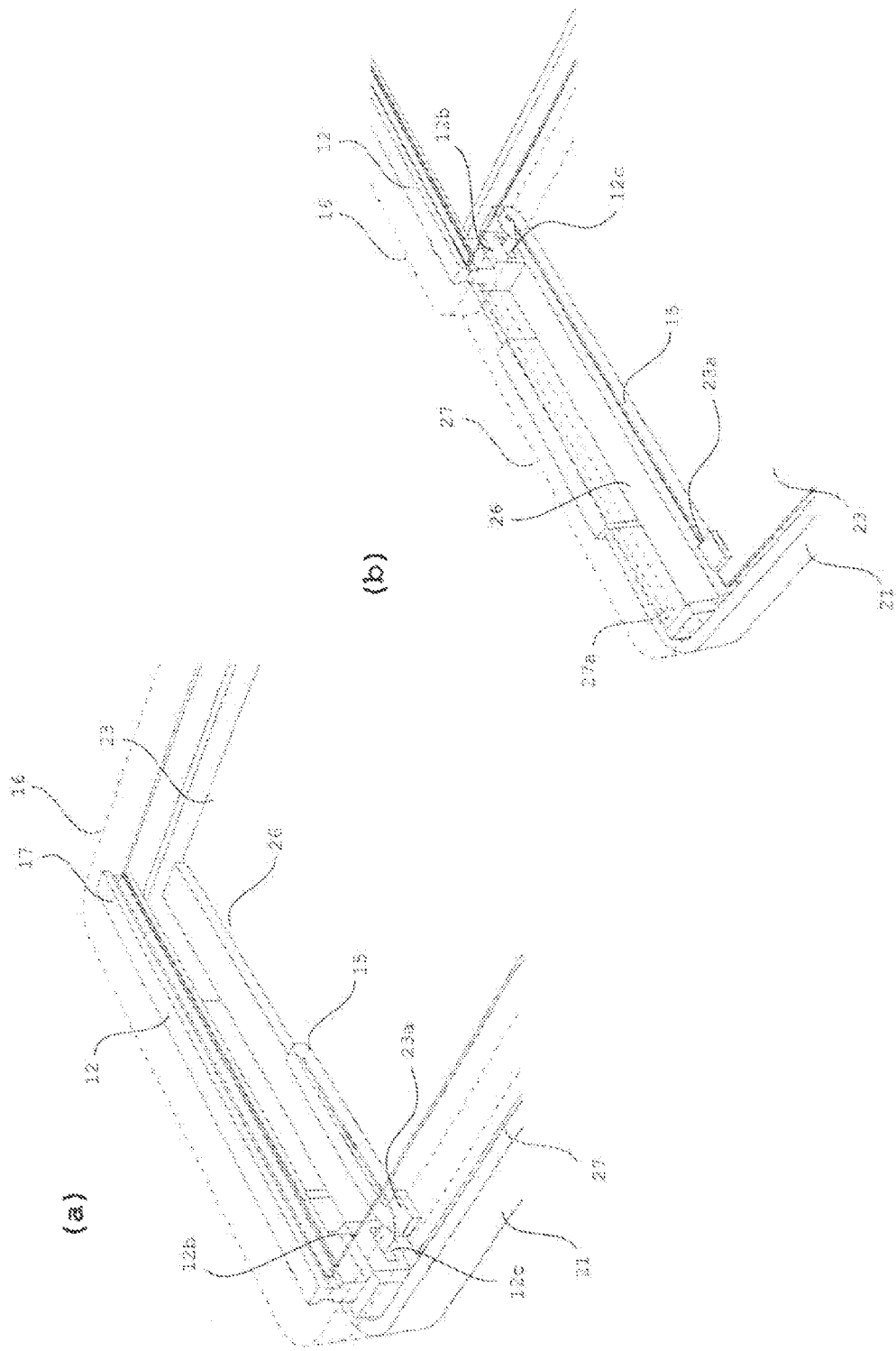
FIGS. 4(a) and 4(b) are diagrams showing perspective views to explain operations of the portable terminal device according to the embodiment.
Figure 9:
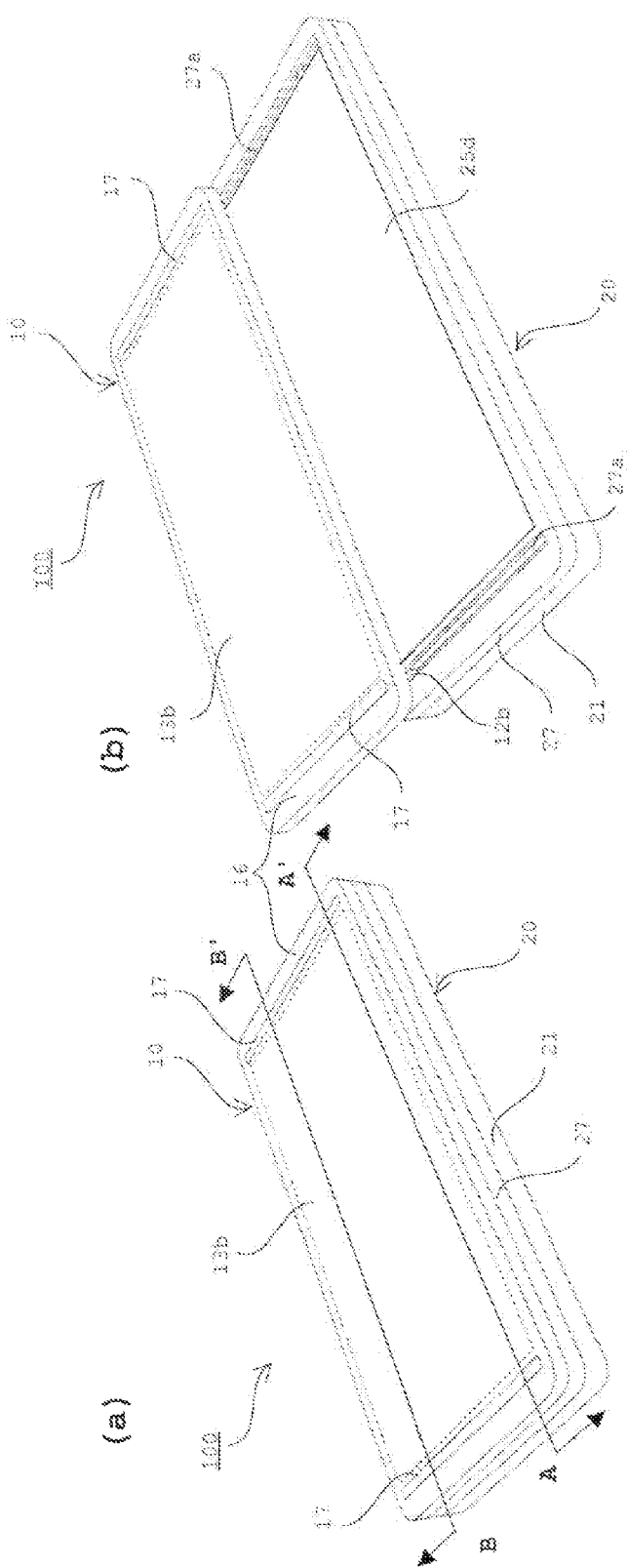
FIGS. 9(a) and 9(b) are diagrams showing a perspective overview of the portable terminal device according to the embodiment.

The portable terminal device 100 related to the second embodiment provides construction shown in FIGS. 3, 4 and 9. That is, the portable terminal device 100 related to the present embodiment provides the construction similar to the one with the portable terminal device 100 related to the first embodiment. However, as shown in FIG. 9, receiving window 107a is not equipped in a front surface of the second unit 20. Also, transmitting window 106a is not equipped in a back surface of the second unit 20, either.

Figure 10:
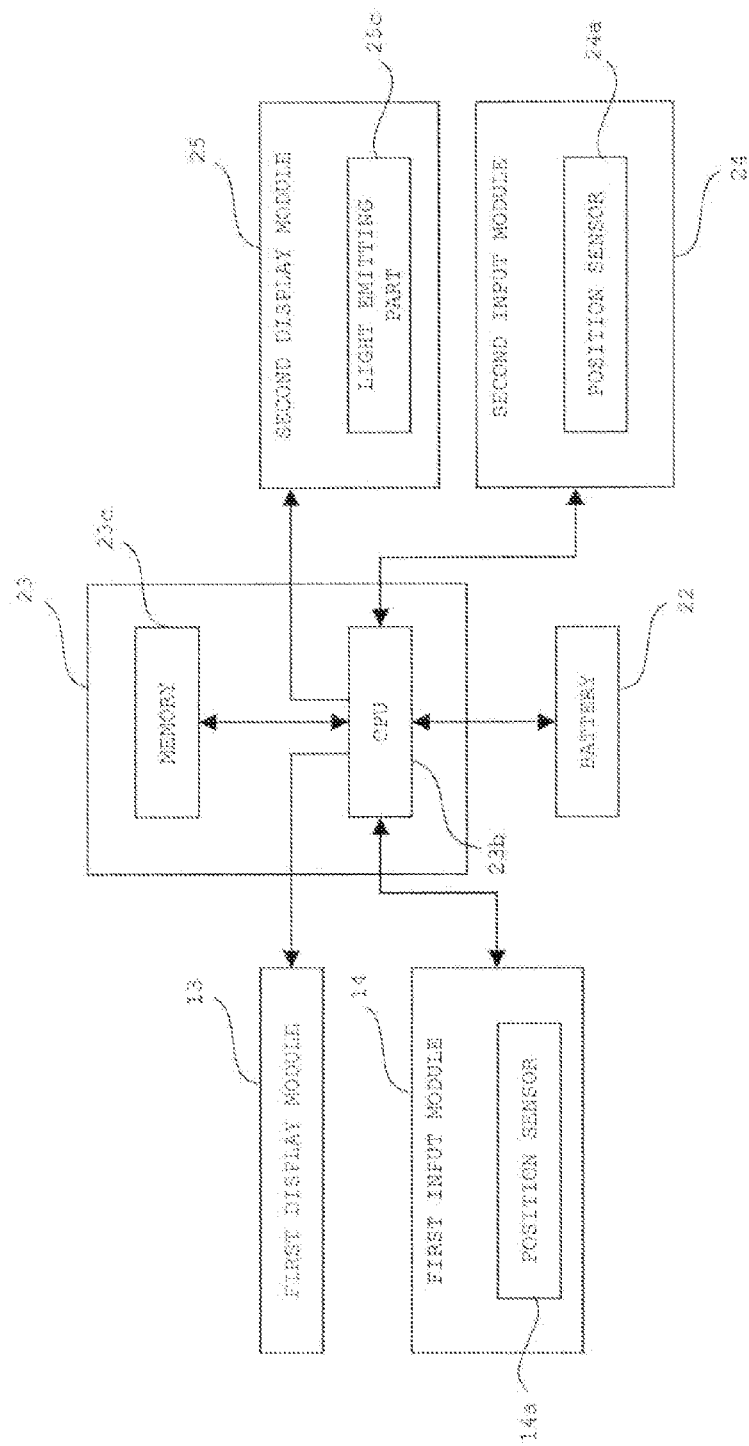
FIG. 10 is a block diagram showing a circuit of the portable terminal device according to the embodiment.

FIG. 10 shows a block diagram of a circuit of the portable terminal device 100.

As shown in FIG. 10, the memory 23c is a storage module including ROM and RAM. The memory 23c stores a control program which gives the CPU 23b a control function. The memory 23c stores image information recorded with a camera module (not illustrated), image information and text information taken in from outside via a communication module (not illustrated), etc., with predetermined file form. The Memory 23c stores information (display contents information) related to contents displayed on each display module 13 and 25, and position specifying information, etc. The display contents information in each display module 13 and 25 includes the color information of the pixel which constructs the image displayed on each display surface 13b and 25d and the position of pixel where the color information is arranged. The positions of icons, buttons, etc., displayed on each display module 13 and 25 is associated with files and programs corresponding to the icons, etc by the position specifying information. It is noted that the color information includes color hue and tone.

The CPU 23b is a display control module which displays images on each display surface 13b and 25d, changes transmittance of the first display module 13, and so on. That is, the CPU 23b receives a positional signal by an operation of the user, a request signal of software, etc. The CPU 23b obtains image data such as photos and drawings by performing processes according to the positional signal, etc., by reading out from the memory 23c, and by receiving via a communication line or internet. The CPU 23b outputs the image data as image signals to the first display module 13 and the second display module 25, and displays images on each display surface 13b and 25d. Also, the CPU 23b controls voltage impressed to transparent electrodes by adjusting the electricity provided from the battery 22, and changes the transmittance of the first display module 13. As a result, the CPU 23b displays object images on the first display module 13, and sets the display area other than the object images in the first display module 13 to a see through state.

The CPU 23b receives positional signals from position sensors 14a and 24a of each input module 14 and 24, and specifies an designated position. The CPU 23b refers to the position specifying information and performs processing of a program, etc., of an icon corresponding to the designated position. Also, the CPU 23b displays images at the designated position.

The CPU 23b is a range detecting module which detects a range designated in an image displayed on each display surface 13b and 25d based on the positions according to the positional signals from each input module 14 and 24.

The CPU 23b is an extracting module which extracts object images included in the designated range from the images displayed on each display surface 13b and 25d. That is, the CPU 23b seeks the range where the user designated to the second display surface 25d from the positional signal from the position sensor 24a of the second input module 24. While referring to the display contents information of the second display surface 25d of the memory 23c, the CPU extracts the object image corresponding to the designated range from the image of the memory 23c.

The portable terminal device 100 has an image capture function explained below. The user can, for example, activate this function by selecting the icon corresponding to the image capture function in the menu screen.

Figure 11:
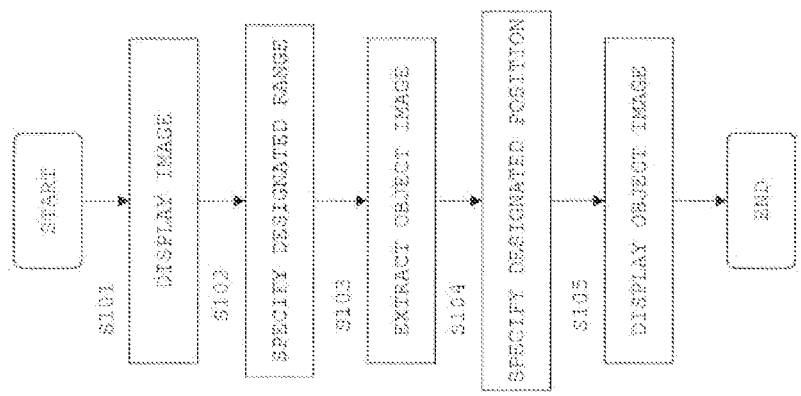
FIG. 11 is a flow chart showing a procedure for processing to display an object image according to the embodiment.
Figure 13:
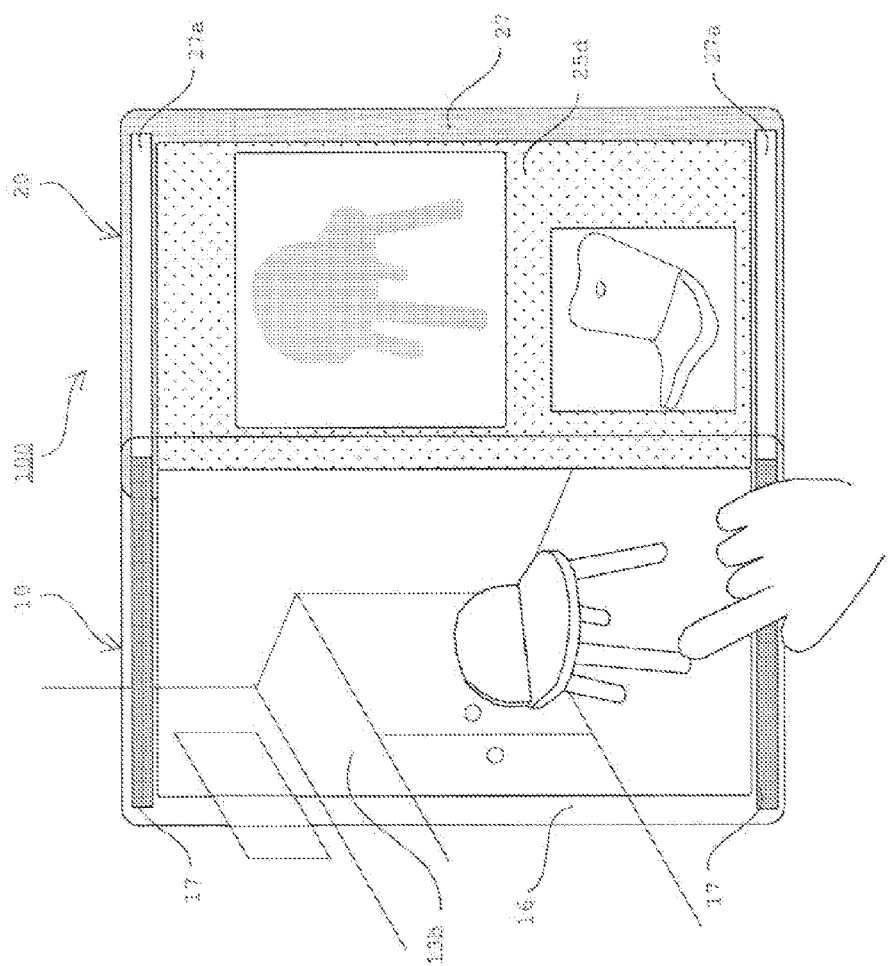
FIG. 13 is a diagram showing a state to display an object image at a specified position on a first display surface according to the embodiment.

FIG. 11 is a flow chart showing a processing order to display an object extracted from an image displayed on the second display module 25 on the first display module 13. FIG. 13 shows the portable terminal device 100 in the second configuration, whose second display surface 25d displays a web page while whose first display surface 13b is transparent. FIG. 13 shows the portable terminal device 100 of the second configuration which displayed the image of a chair extracted from the web page displayed on the second display surface 25d on the first display surface 13b.

Figure 12:
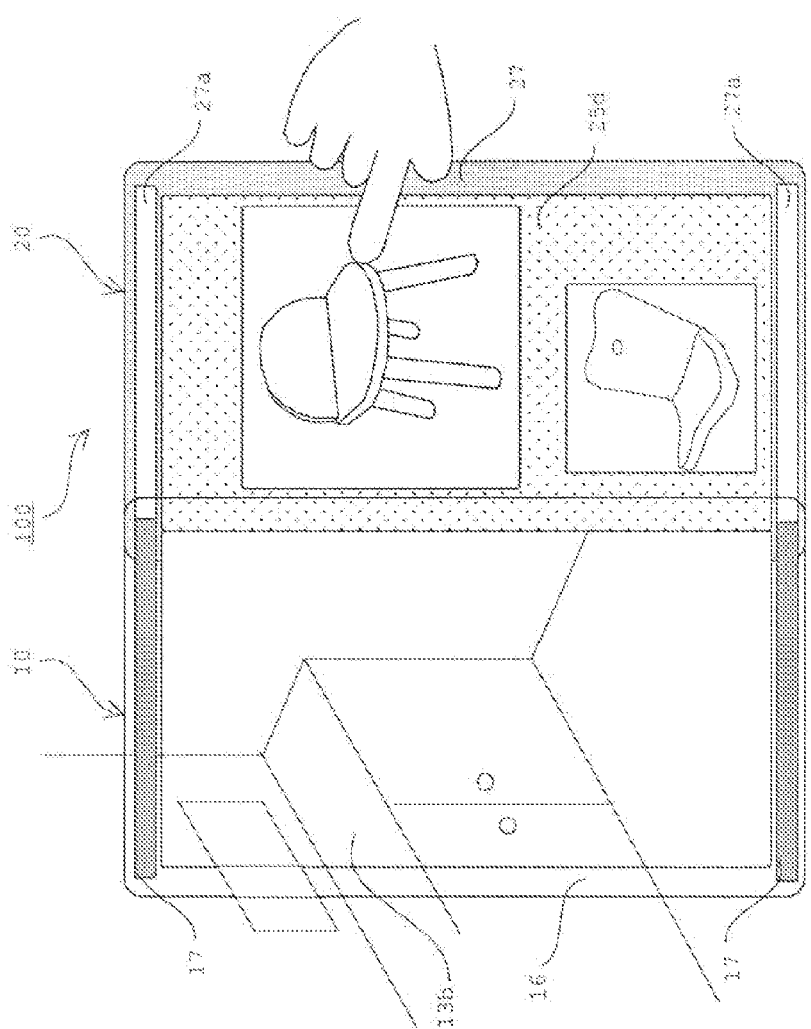
FIG. 12 is a diagram showing a state to specify an object image on a second display surface according to the embodiment.

As shown in FIG. 12, the user performs an operation of connecting the internet to the second input module 24 while the first display surface 13b and the second display surface 25d are aligned, and the second display surface 25d is exposed. As a result, the CPU 23b obtains image information of a web page via internet, and displays the web page on the second display module 25 (S101). Here, the web page contains images of two chairs. Also, color information of each pixel of the image displayed on the second display surface 25d and the position the pixel is arranged are associated with each other and stored in the memory 23c as display content information.

When the user traces an outline of an image of a chair with the finger while inputting positions traced by touching the second display surface 25d with the finger, the second input module 24 detects the position touched and transmits the position to the CPU 23b by generating a positional signal. The CPU 23b receives the positional signal and specifies a range designated by the user from the designated position on the second display surface 25d (S102).

The CPU 23b compares positions of the display contents information of the memory 23c and the designated range, and seeks the color information of pixel included in the designated range and the position where the pixel are arranged. This allows the CPU 23b specify an image displayed on the designated range among the images displayed on the second display surface 25d, and stores this image in the memory 23c by extracting this image as the object image (S103). In this case, the image of the chair displayed on the second display surface 25d is extracted as the object image.

Also, the CPU 23b controls the electricity supply from the battery 22 to the first display module 13 to an off state. This makes the first display module 13 become light transmissive, and therefore the user can see through the scenery behind the first unit 10 via the first unit 10 including the transparent first display module 13. The user directs the first display surface 13b to a place where the user wants to put the chair. Then, as shown in FIG. 13, the user touches the position where the chair is placed in the scenery seen in the first display surface 13b by touching the first display surface 13b. As such, when the arranged position of the object image in the first display surface 13b is designated, the first input module 14 detects the position where the finger is touched, and outputs the signal according to the position to the CPU 23b. The CPU 23b receives the positional signal and seeks the position designated by the user (S104).

The CPU 23b reads out the object image from the memory 23c, and extracts the arrangement of the color information of the pixel included in the object image. The CPU 23b converts the arrangement of the color information of the object image to the position of the color information arranged on the first display surface 13b based on the position designated by the user. The CPU 23b outputs the color information of the object image and the position of the color information on the first display surface 13b by turning them to image signals to the first display module 13. The first display module 13 shows the colors according to the color information at each position in the first display surface 13b. This makes the object image of the chair be displayed at the position designated by the user in the first display surface 13b (S105). Also, in the first display surface 13b, since the scenery area other than the object image is transparent, the scenery behind the first display surface 13b looks as the scenery of the chair. Furthermore, surrounding light is also irradiated on the first display module 13, so it is also used as illumination for the first display module 13.

As described above, according to the present embodiment, by specifying the range to an image displayed on the second display surface 25d, a desired object image included in the range among the images on the second display surface 25d can be easily extracted.

Also, according to the present embodiment, since the other side is visible through the first display surface 13b, the object image can be displayed on the first display surface 13b with the scenery seen on the other side as a background. Then, the user can designate a desired position of the object image instinctively according to the scenery while looking at the scenery behind on the first display surface 13b passing through the transparent part of the first unit 10. Also, just changing the direction and position of the first display module 13 changes the places in the background room together with the image of the chair in real time, so the chair and the room can be easily compared.

<Modification Example>

Figure 14:
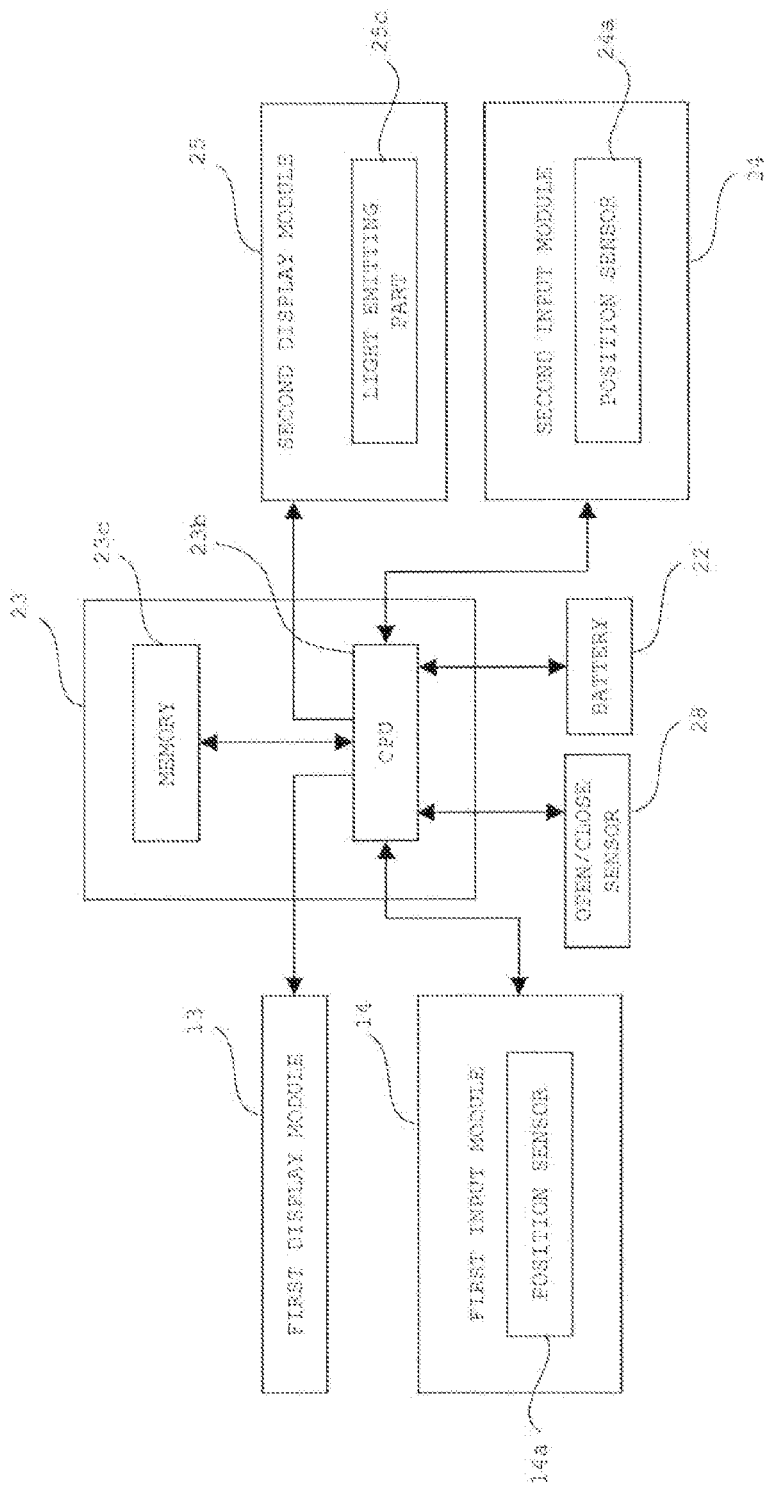
FIG. 14 is a block diagram showing a circuit of the portable terminal device according to the embodiment.

In a modification example of the second embodiment, the CPU 23b determines that the portable terminal device 100 is in the first configuration if a detection signal from the open/close sensor 28 shown in FIG. 14 is input. In the first configuration, since the first input module 14 is superimposed over the second display surface 25d, the CPU 23b switches the first input module 14 as the input module for the second display surface 25d. As a result, the first input module 14 detects an input for the second display module 25 instead of the second input module 24. Then, when the CPU 23b receives a positional signal from the first input module 14, the designated position of the positional signal and the image of the second display surface 25d are associated with each other, and a predetermined process is performed. When the image signal is generated as a result of the performance of the processing, the CPU 23b outputs the image signal to the second display module 25, and the image is displayed on the second display surface 25d.

On the other hand, when the detection signal from the open/close sensor 28 is not input, the CPU 23b determines the portable terminal device 100 is in the second configuration. In the second configuration, the CPU 23b uses the first input module 14 as the input module for the first display module 13 and the second input module 24 as the input module for the second display module 25.

Figure 15:
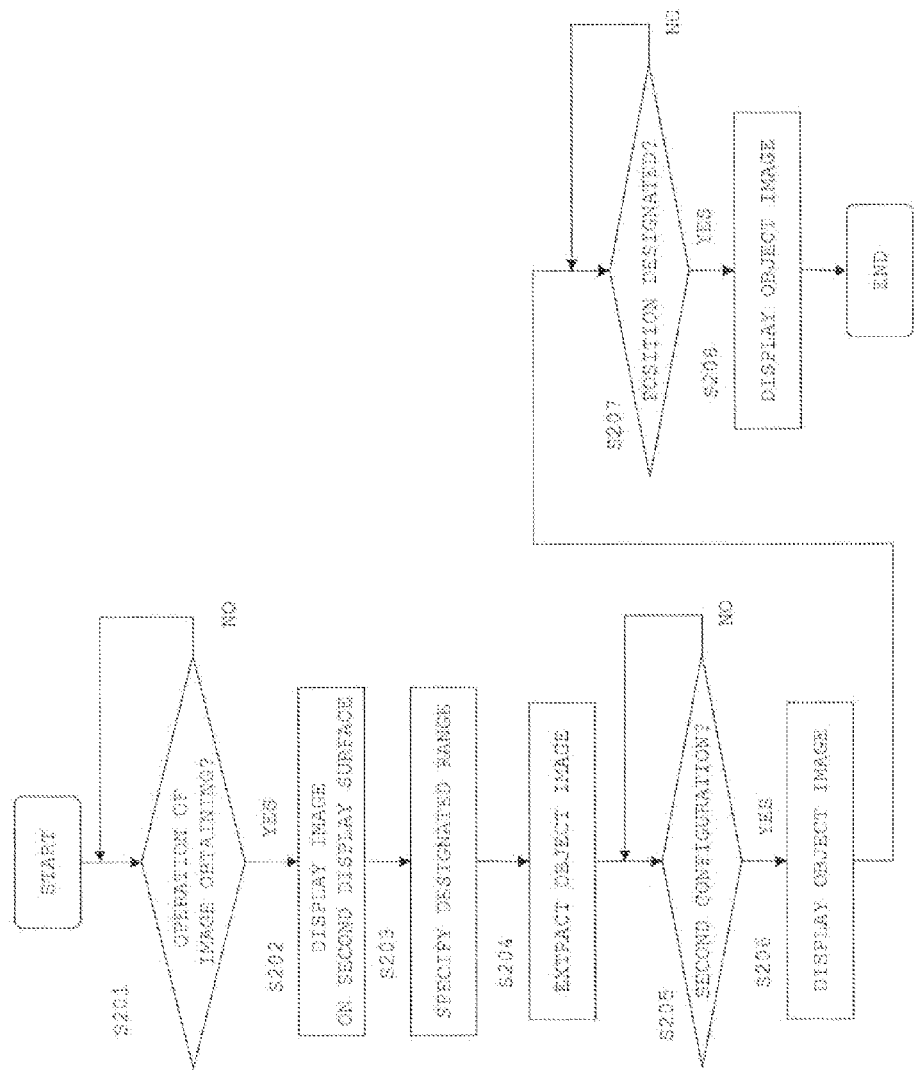
FIG. 15 is a flow chart showing a procedure for processing to display an object image according to the embodiment.
Figure 16:
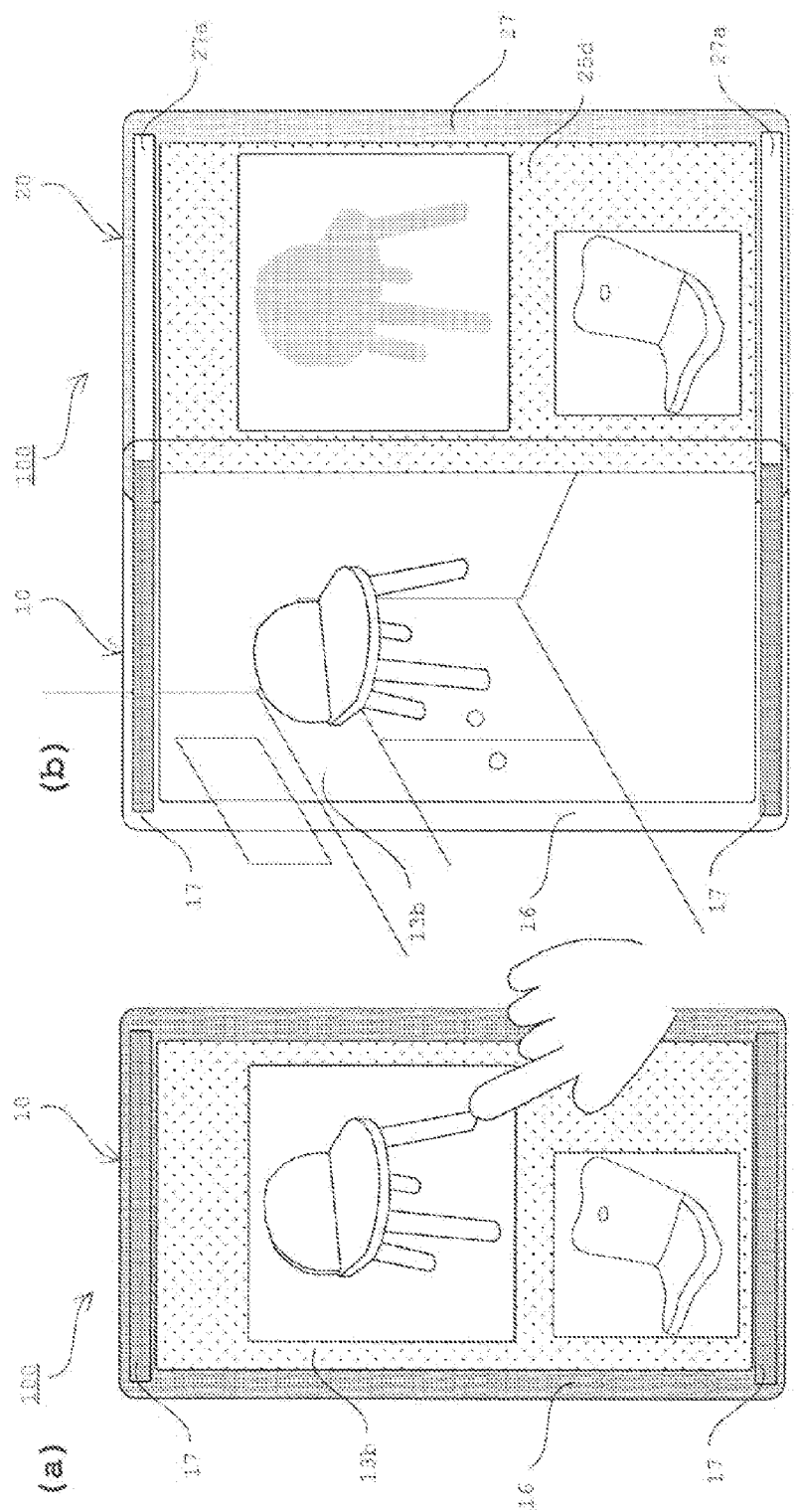
FIGS. 16(a) and 16(b) are diagrams showing a state to display the object image specified to the second display surface on the first display surface according to the embodiment.

FIG. 15 is a flow chart showing a procedure for processing to display an object extracted from an image displayed on the second display module 25 on the first display module 13. FIG. 16(a) shows the portable terminal device 100 in the first configuration, whose second display surface 25d displays a web page while whose first display surface 13b is transparent. FIG. 16(b) shows the portable terminal device 100 of the second configuration which displayed an image of a chair extracted from the web page of the second display surface 25d on the first display surface 13b.

When the portable terminal device 100 is determined to be in a state of a first configuration according to the signal from the open/close sensor 28, the CPU 23b displays an input screen to obtain a desired image on the first display surface 13b and waits for a positional signal from the first input module 14.

The user operates to obtain an image, such as a web page, against the first input module 14 exposed while keeping the device in a state of the first configuration. When the CPU 23b determines that the operation to obtain an image is performed according to the positional signal from the first input module (S201: YES), performs a processing according to the positional signal from the first input module 14 to the second display surface 25d, and for example, as shown in FIG. 16(a), displays the web page including the image of the chair on the second display surface 25d (S202). Then, the color information of pixel of the image displayed on the second display surface 25d and the position where the pixel are arranged are associated with each other and stored in the memory 23c as the display contents information. It is noted that, the CPU 23b controls the electricity supply from the battery 22 to an off state and has the first display module 13 transparent.

Since the user operates the first input module 14 while s/he looks at the second display surface 25d through the transparent first display surface 13b, the positional signal from the first input module 14 will be switched from the input signal to the first display surface 13b to the input signal to the second display surface 25d. Thus, when the user traces the outline of the image of the chair by touching the first display surface 13b, the first input module 14 detects the position touched and outputs the positional signal according to the touched position to the CPU 23b. The CPU 23b receives the positional signal from the first input module 14, seeks a designated position on the second display surface 25d from the positional signal, and further specifies the range that the user designates based on the designated position (S203).

While referring the position of the display contents information of the memory 23c, the CPU 23b extracts the color information corresponding to the position of the designated range. With this, the color information of the pixel included in the designated range, and the position where the pixel are arranged are extracted as object image information of the chair and stored in the memory 23c (S204).

Next, when the user slides the first unit 10 with respect to the second unit 20, and makes the portable terminal device 100 be second configuration, the open/close sensor 28 stops outputting the detection signal to the CPU 23b. As a result, the CPU 23b stops receiving the detection signal from the open/close sensor 28, and it is determined that the portable terminal device 100 is switched to the second configuration (S205: YES).

The CPU 23b reads out the object image from the memory 23c, extracts the position of the color information of the object image, and converts this position to the position of the color information arranged on the first display surface 13b. The CPU 23b converts the color information of the object image and the position of the color information in the first display surface 13b into the image signal and outputs the image signal to the first display module 13. The first display module 13 displays the object image of the chair on the first display surface 13b by showing colors according to the color information on each position of the first display surface 13b (S206).

At this time, since the first unit 10 is pulled out, the positional signal from the first input module 14 is returned to an input signal to the first display surface 13b from an input signal to the second display surface 25d. Also, the user can see the scenery behind on the first display surface 13b through the transparent first unit 10 in the background area other than the object image. Because it may be possible to be changed the arrangement of the object image according to this scenery, the CPU 23b determines whether there is an indication on a position by the user or not (S207).

When the user touches the first display surface 13b and designates the changed position of the object image, the first input module 14 outputs the signal according to the touched position to the CPU 23b. The CPU 23b receives the positional signal from the first input module 14 and determines that the position of the object image is designated (S207: YES).

The CPU 23b converts the position of the object image displayed into the position based on the designated position according to the positional signal, then as shown in FIG. 16(b), displays the object image on the user's designated position (S208).

According to the present modification example, in the portable terminal device 100 of the first configuration, since the first input module 14 detects an input to the second display surface 25d, the image displayed on the position of the second display module 25 corresponding to the designated position of the first display surface 13b is extracted as the object image. For this reason, the object image among images on the second display surface 25d via the first display surface 13b can be specified.

<Other Modification Examples>

The embodiment of the present invention has been described above, but the present invention is not limited to the above embodiment, and the embodiment of the present invention may be variously modified.

For example, in the above second embodiment, an image displayed in a range designated was specified as an object image by being designated a range in the second display surface 25d by the user. In contrast, it is possible to use an image recognition program specifying the object image by distinguishing a background image and the object image using special features such as color continuity and distribution, etc., to the position change.

Figure 17:
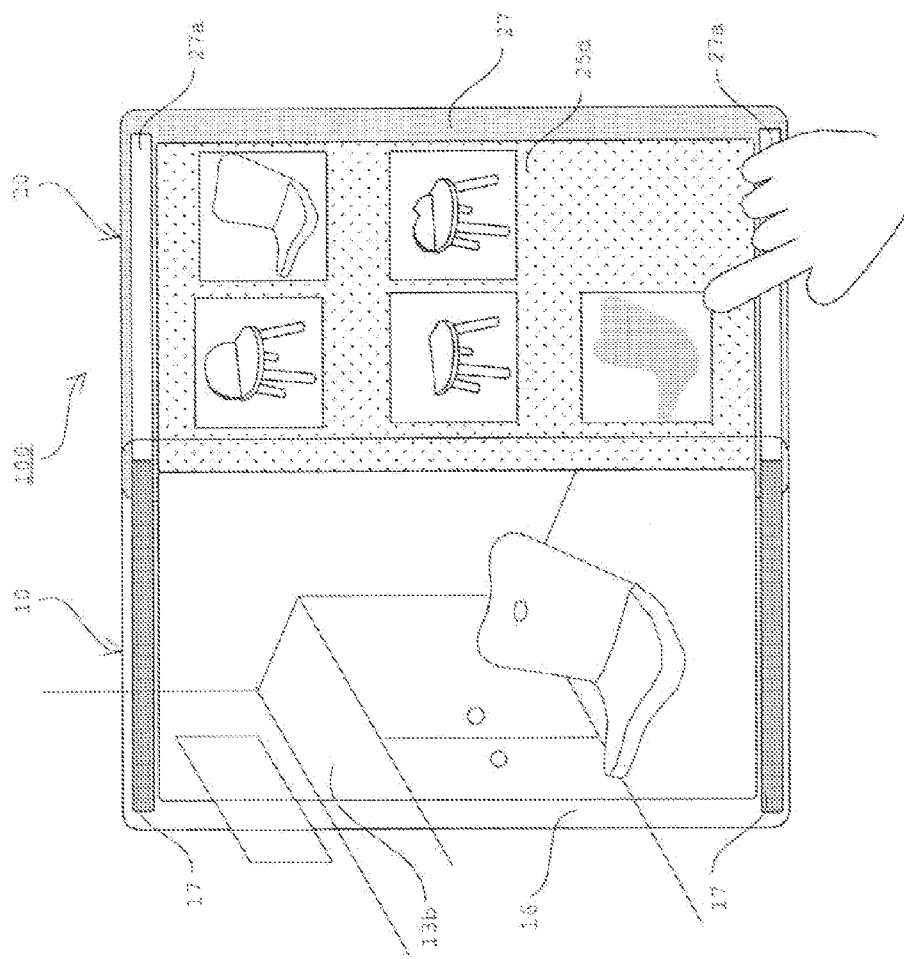
FIG. 17 is a diagram showing a state to display the object image specified to the second display surface on the first display surface according to the embodiment.

Also, in the above second embodiment, the user can extracts a plurality of object images among images displayed on the second display surface 25d in advance and stores in a memory. In this case, after all of the object images are extracted, as shown in FIG. 17, these object images are displayed on the second display surface 25d as thumbnails. Then, in the first display surface 13b, the user designates the position where the object images be arranged. After that, among the plurality of the objects displayed as thumbnails, the user touches the first object image with a finger and specifies, the first object image is displayed at the arranged position of the first display surface 13b. Then, the second object image is specified among the plurality of the object images, and the second object image is displayed instead of the first object image at the arranged position. With such a construction, objection images can be easily changed one after another.

Further, in the above second embodiment, based on the predetermined operations, the CPU 23b may change the size of the object image displayed on the first display surface 13b. This can make the size of the object image adjusted according to the scenery of a room seen through the first display surface 13b.

Also, in the above second embodiment, the first unit 10 is arranged to be able to move in a linear manner with respect to the second unit 20, however the first unit 10 maybe arranged to rotate around a predetermined axis vertical to the display surface of the second unit 20. Also, the portable terminal device 100 can be a folding type. That is, the first unit 10 may be arranged to rotate around a predetermined axis horizontal to the display surface of the second unit 20.

Also, in the above second embodiment, while in a state an image capture function is used, an incoming call is arrived, the CPU 23b can display a message notifying the arrival of the call, and it is also capable of displaying an answer and not answer buttons on each display module 13 and 25. At this time, after the information related to the image capture function is stored and then the image capture function is set to be on hold. When the user touches the display position of the answer button, a line of contact is connected, and the user can answer the incoming call. On the other hand, when the user touches the display position of not answer button, the line of contact is cut off. Then, when the line of contact is cut off because of the end of a call or by denying answering, the holding of the image capture function is released, the information on this function is read out, and the screen returns to the state before the image capture function was on hold. It is noted that, the massage can be the effect that incoming call is arrived, the phone number and name of the caller of the incoming call, etc. The name of the caller is obtained based on the contact information in which the name and the telephone number are associated with each other and stored.

Furthermore, in the above second embodiment, a positioning module can be provided. The positioning module receives signals from GPS satellites, signals from base stations within communication range, and so on, seeks the position from these signals and outputs a signal according to the position to the CPU 23b. For example, when an image capture function is reserved, the CPU 23b obtains the position of the portable terminal device 100 from the positioning module and stores the position in the memory 23c. When this reserved state is released, the CPU 23b obtains the position of the portable terminal device 100 again and compares the position with the position at the reserved time. When these positions are larger than predetermined threshold value, it is considered that the user left the room s/he used the image capture function and moved to the other place, and the use of the function was over, therefore the reservation of the function is released and the function is terminated. This avoids the trouble of having to terminate the function.

It is noted that, in the above second embodiment, the portable terminal device 100 was operated by touching each display surface 13b and 25d and by being detected with each input module 14 and 24, however it is possible to provide operation keys to the side surfaces, and so on, of each unit 10 and 20. For example, when the user presses the operation keys, s/he can answer the incoming phone call and terminate the call.

The second embodiment of the present invention may be modified variously and suitably within the scope of the technical idea described in claims.

It is noted that, in the second embodiment, simply superimposing an image over an actual scenery makes a display on the portable terminal device interesting, functional and high value.

As described above, according to the portable terminal device of the present invention related to the second embodiment, an image can be easily superimposed over an actual scenery.

<Third Embodiment>

The portable terminal device 100 related to the third embodiment provides constructions shown in FIGS. 2-4 and 9, as the same with the portable terminal device 100 related to the second embodiment.

Figure 18:
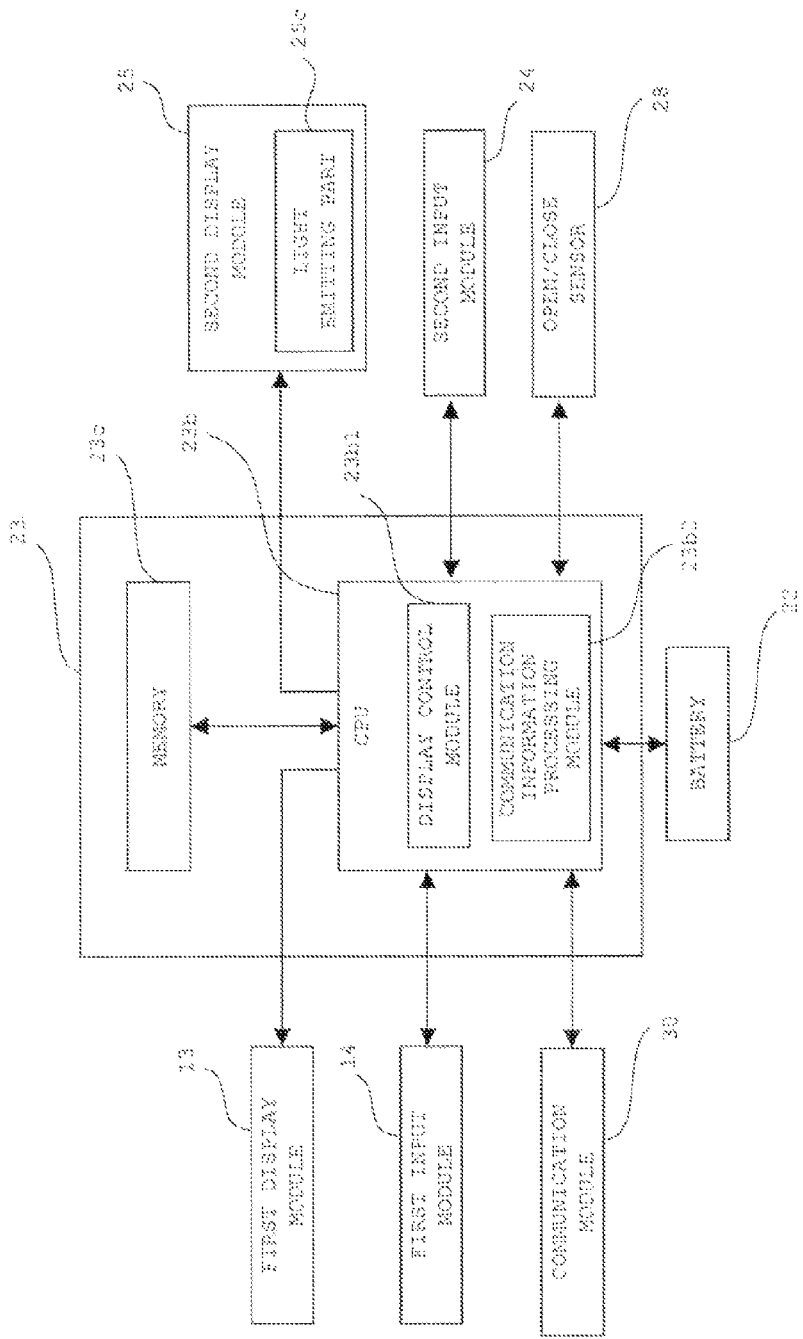
FIG. 18 is a block diagram showing a circuit of the portable terminal device according to the embodiment.

FIG. 18 shows a block diagram of a circuit of the portable terminal device 100.

The communication module 30 is a transmitting module which transmits communication information such as phone calls and electronic mails, etc. The communication module 30 converts a audio signal, an image signal, a text signal, etc., from the CPU 23b into a radio signals and transmits the radio signals to a base station via an antenna. The communication module 30 is also a receiving module receives the communication information such as phone calls and electronic mails, etc., and the radio signals such as TV, and so on via the antenna. The communication module 30 converts received the radio signals into the audio signal, the image signal, the text signal, and so on, and outputs these signals to the CPU 23b.

The memory 23c is a storage module including ROM and RAM. The memory 23c stores a control program which gives the CPU 23b a control function. Also, the memory 23c stores image information recorded by a camera module (not illustrated), image information took in from outside via the communication module, and text information, etc., in predetermined file forms.

The CPU 23c has display control module 23b1 and communication information processing module 23b2. Each module is realized as a function of a program performed by the CPU 23b.

The communication information processing module 23b2 creates a message notifying that the communication information is received by the communication module 30.

Figure 19:
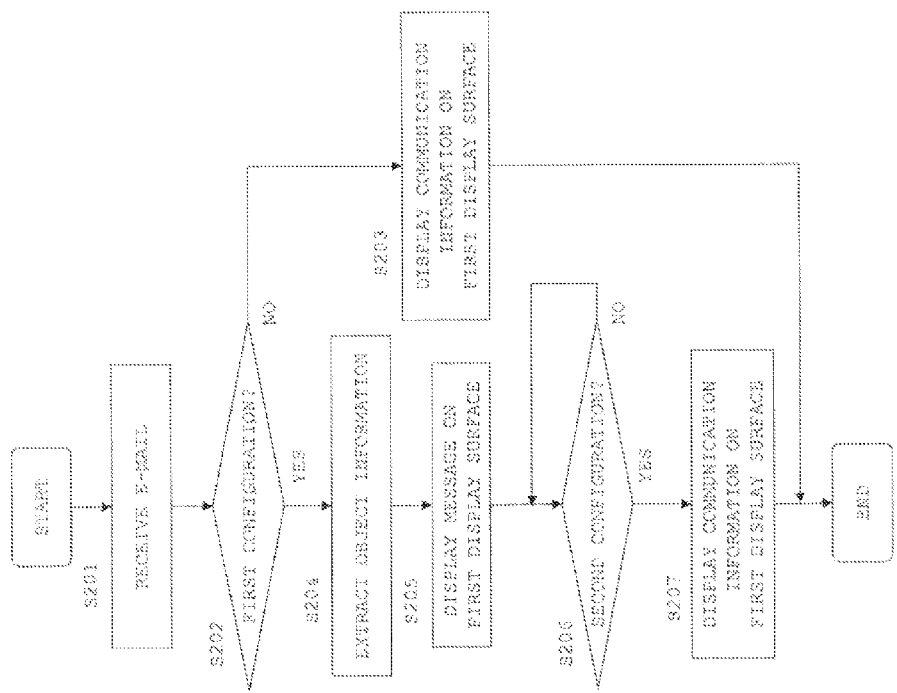
FIG. 19 is a flow chart showing a procedure for processing to display a message according to the embodiment.

FIG. 19 is a flow chart showing a procedure for processing to display a message on the display surface. FIG. 20(a) shows the portable terminal device 100 of the first configuration which displays a message on the first display surface 13b. FIG. 20(b) shows the portable terminal device 100 of the second configuration which displays received communication information on the first display surface 13b.

When a function to display a message is selected by operating each display surface 13b and 25d by the user, a control mode of this function is activated.

As shown in FIGS. 20(a) and (b), in the first or the second configuration, a program displaying TV pictures is activated, and the TV pictures are displayed on the second display surface 25d. It is noted that, in the first configuration, the first display module 13 is set to be in a see through state, and the first display module 13 is superimposed on the second display surface 25d. For this reason, the user can see the TV pictures displayed on the second display surface 25d through the first display surface 13b.

As such, in a state while an image is displayed on the second display surface 25d, if an electric mail is received by the communication module 30 (S201), the electric mail is stored in the memory 23c, and it is determined if there was a signal from the open/close sensor 28 or not. If there was no detection signal input from the open/close sensor 28, the CPU 23b determines that the portable terminal device 100 is in open state and this display configuration is the second configuration (S202: NO).

As shown in FIG. 20(b), in the second configuration, the first display surface 13b and the second display surface 25d are aligned side by side, and the user can see the both display surfaces. For this reason, the communication information processing module 23b2 reads out all electric mail information from the memory 23c. Then, the display control module 23b1 leaves the second display surface 25d displaying the TV pictures, and displays all the electric mail information on the first display surface 13b. All the electric mail information is, for example, a title, transmitter's name, transmitting date and time, and the body. Because of this, a received e-mail is displayed on the first display surface 13b without interfering the TV pictures displayed on the second display surface 25d, and receipt of the e-mail is notified.

On the other hand, the CPU 23*b* determines that the portable terminal device 100 is in the closed state and this display configuration is the first configuration when the detection signal showing the closed state from the open/close sensor 28 is input (S202: YES).

Then, the communication information processing module 23*b*2 creates a message notifying that the e-mail is received. Here, the communication information processing module 23*b*2 extracts the title among information of stored e-mails in the memory 23*c*, and with this title, a message is composed (S204).

Figure 20:
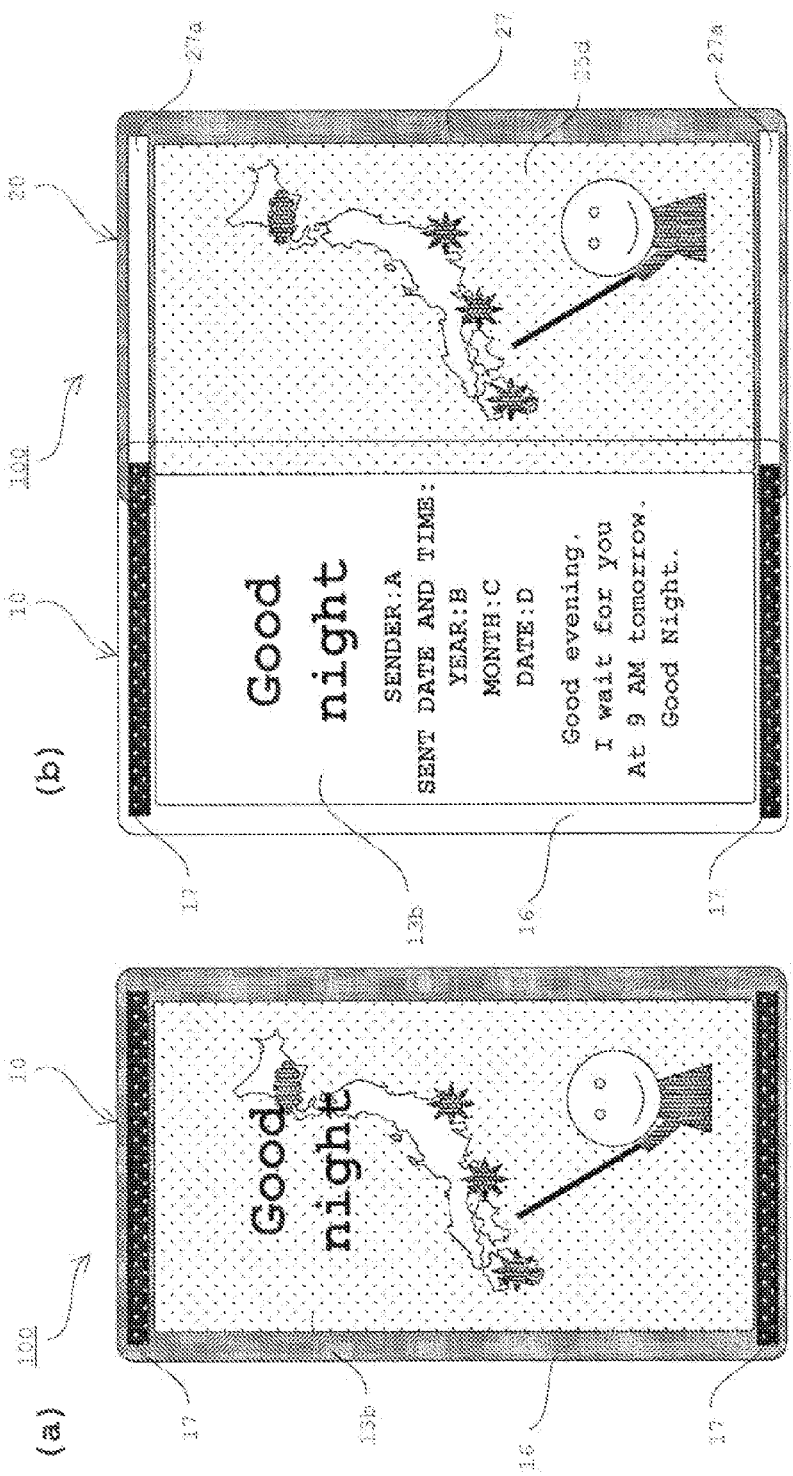
FIGS. 20(a) and 20(b) are diagrams showing a state to display a message on the first display surface according to the embodiment.

The display control module 23*b*1 reads out the title from the memory 23*c*, and displays the title on the first display surface 13*b* as a message (S205). As a result, as shown in FIG. 20(*a*), over the second display surface 25*d* on which TV pictures are displayed, a message displayed on the first display surface 13*b* is shown. In this case, the title of the e-mail "Good Night" is shown on the second display surface 25*d* and the receipt of the e-mail is notified.

When the user noticed the message and switches the portable terminal device 100 from the first configuration to the second configuration, the detection signal showing the closed state from the open/close sensor 28 will be gone. For this reason, the CPU 23*b* determines that the portable terminal device 100 is in the open state and the display configuration is the second configuration (S206: YES).

In the second configuration, since the first display surface 13*b* is arranged next to the second display surface 25*d*, the communication information processing module 23*b*2 reads out all the information of the e-mail from the memory 23*c*. Then, as shown in FIG. 20(*b*), the display control module 23*b*1 continues to display the TV pictures on the second display surface 25*d* while all the information of the e-mail as information corresponding to the message is displayed on the first display surface 13*b* (S207). This allows the user to see all the information of the e-mail without being interrupted while watching the TV pictures.

As described above, according to the present embodiment, when an image is displayed on the second display surface 25*d*, a part of information of an e-mail is displayed on the first display surface 13*b*. This allows notifying the user a receipt of the e-mail by displaying the information of the e-mail on the first display surface 13*b* without interrupting the processing of displaying the image on the second display surface 25*d*.

Also, according to the present embodiment, in the first configuration, an image is displayed on the second display surface 25*d*, and a message is displayed on the first display surface 13*b* over it. Therefore, the massage is overlapping on the image of the second display surface 25*d*, however the image and the message have different display surfaces, and there is a distance between these display surfaces. This makes the user easy to find that the image on the second display surface 25*d* and the message are different. Thus, the user does not confuse the image of the second display surface 25*d* with the message, and the user can tell that the e-mail has arrived because of the message while looking at the image of the second display surface 25*d*.

Further, according to the present embodiment, in the first configuration, the display area other than the message in the first display surface 13*b* is set to a see through state. Thus, the user can continue looking at the image of the second display surface 25*d* via the display area in a see through state.

Also, according to the present embodiment, the user only needs to switch the portable terminal device 100 from the first configuration to the second configuration to display all the information of the e-mails on the first display surface 13*b*. For this reason, the user can see the information of the e-mail on the first display surface 13*b* aligned next to the second display 25*d* while looking at the image on the second display surface 25*d*.

<Modification Example>

The embodiment of the present invention has been described above, but the present invention is not limited to the above embodiment, and the embodiment of the present invention may be variously modified.

According to the above third embodiment, the communication information processing module 23*b*2 extracted a title from the information of the e-mail, and the message is composed from this title. In contrast, the communication information processing module 23*b*2 extracts a part of the body of the e-mail, e-mail address of the transmitter, etc., and then the message can be composed from these. It is noted that, in a case of using the transmitter's e-mail address, the name of the transmitter can be obtained from the address book stored in the memory 23*c*, and the name of the transmitter can also be used as a message.

Besides, the communication information processing module 23*b*2 created a message from information of a part of the information of the received e-mail. However, it is not limited to the above if it is something to notify the receipt of the e-mail. For example, all of the information of the received e-mail can be used as the massage. Also, a previously prepared text such as "receipt of an e-mail" can be a message. Further, previously specified graphics, symbols, etc., can be used as a message.

Figure 21:
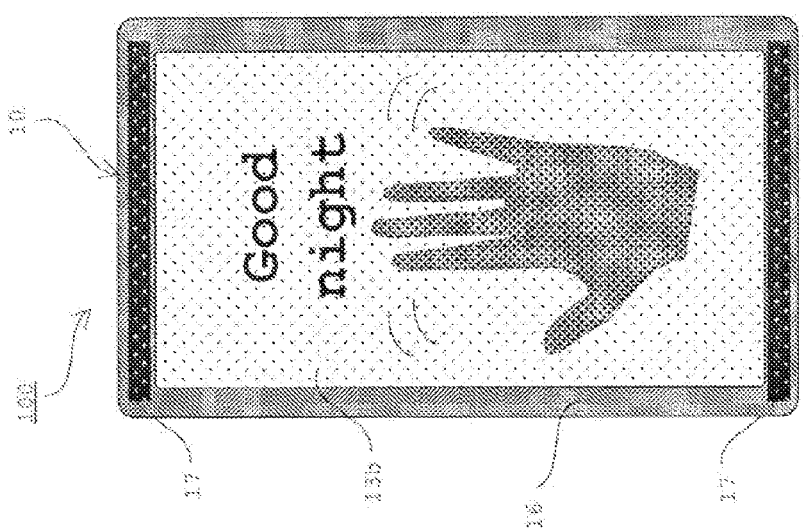
FIG. 21 is a diagram showing a state to display a message on the first display surface according to the embodiment.

Further, in the above embodiment, when an image information, etc., is attached to information of an e-mail, a message can be composed from this attached information. For example, the communication information processing module 23*b*2 extracts a title and attached movie from the information of the e-mail. Then, as shown in FIG. 21, the display control module 23*b*1 displays the title on the first display surface 13*b*, and the movie of a waving hand is shown on the background.

According to the above third embodiment, the communication information processing module 23*b*2 created a message notifying the receipt of an e-mail, and a message notifying a receipt of an incoming call signal can also be composed.

For example, messages may be a predetermined message such as arriving, and so on, a phone number of a caller of the information with the incoming call signal, a name of the caller, and registered photos related to the caller, etc. It is noted that, the name of the caller may be obtained by referring the address book stored in the memory 23*c* and from the phone number of the caller. Also, the registered images related to the caller is associated with the caller's phone number and stored in the memory 23*c* by the user of the portable terminal device 100. The registered image related to the caller can be the image related to the caller, such as a photo of the caller, etc., or the image does not need to be related to the caller.

Figure 22:
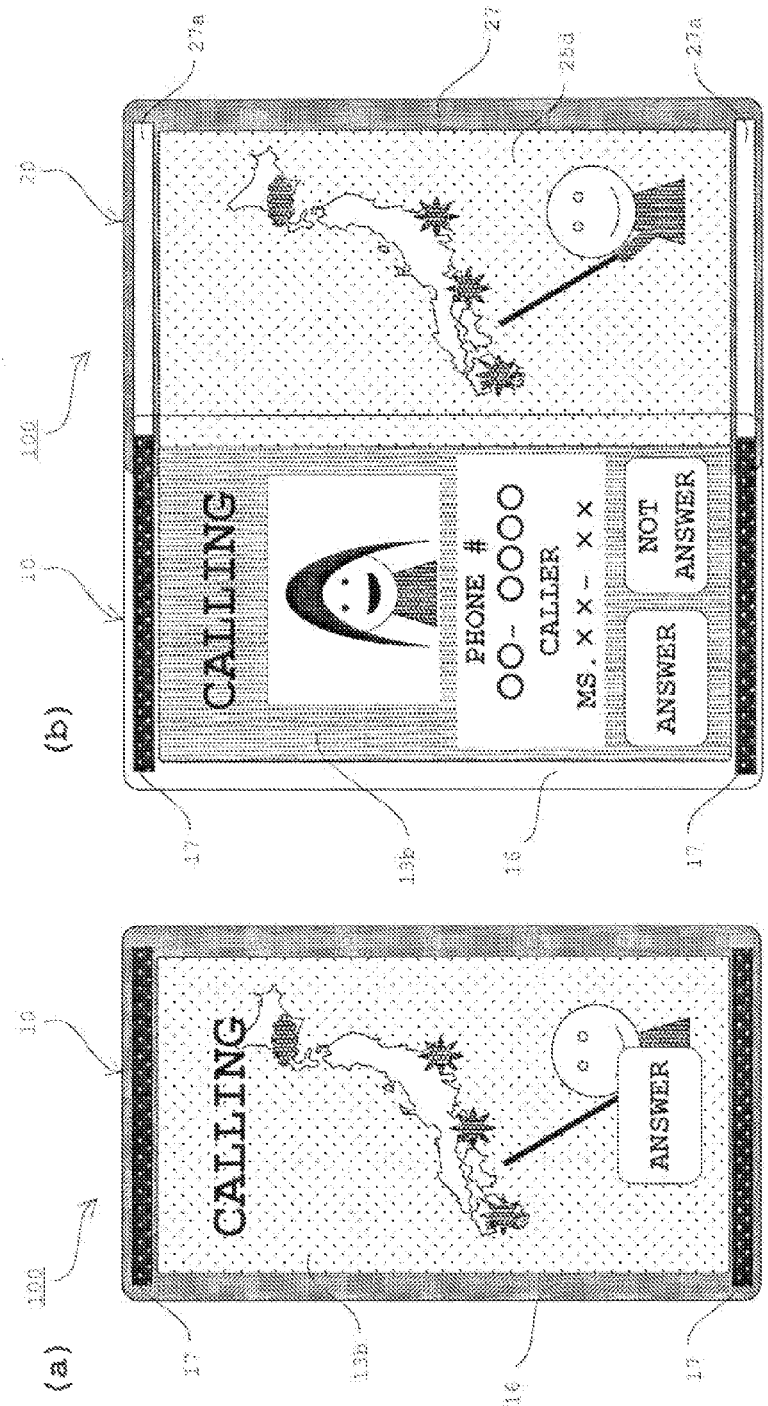
FIGS. 22(a) and 22(b) are diagrams showing a state to display a message on the first display surface according to the embodiment.

Further, as shown in FIG. 22(*a*), when a predetermined message such as "call receiving" is displayed on the first display surface 13*b*, "answer" button can be displayed on the first display surface 13*b*. This makes the user realize that a phone call has arrived from the message, and the user can answer the call by selecting the "answer" button.

Further, when answering after identifying the other person, the user switches the portable terminal device 100 from the first configuration to the second configuration. As a result, as shown in FIG. 22(*b*), the registered image related to the caller, caller's phone number "co-coca" comes with the incoming call signal and the caller's name "xx-xxxx" are displayed on the first display surface 13*b* as information attached with the message. From the displayed registered photos, phone number, and the name related to the caller, the user can distinguish the caller.

Also, with the phone number, buttons showing "answer" and "not answer" are displayed on the first display surface 13b. The user can answer or not answer to the incoming call according to the caller by selecting the "answer" button or "not answer" button.

Also, as such, until the portable terminal device is switched to the open state, the phone number and the mane of the caller are not displayed. Thus, if the portable terminal device 100 is not switched the state, the caller's privacy such as phone number, etc., is protected.

Moreover, in the above third embodiment, a process to delete the message can be established. For example, the display control module 23b1 displays the message delete button with the message. When this delete button is selected by a user, the message would not be displayed on the first display surface 13b. For this reason, when user is notified that the e-mail is received with the message, the user can delete the message according to his will. In addition, when the message is displayed, the message can be hidden from the first display surface 13b after a predetermined time has passed. This makes the message erased without the user operates anything.

Besides, according to the above third embodiment, when the portable terminal device 100 is switched from the first configuration to the second configuration, all the information of the e-mail is displayed on the first display surface 13b. However, on the second display surface 25d, or on both the first display surface 13b and the second display surface 25d, the information of the e-mail can be displayed.

Further, in the above third embodiment, all the information of the e-mail was displayed on the first display surface 13b, however only a part of the information can be displayed. Also, if all the information of the e-mail cannot be displayed in a screen, the screen can be scrolled to show all the information of the e-mail.

Besides, in the above third embodiment, TV pictures were displayed on the second display surface 25d, but the image to be displayed on the second display surface 25d is not limited to these, and images can be user's browsing target and operation target, etc. For example, images performed with other programs such as an e-mail, a memo, and so on.

Furthermore, in the above third embodiment, communication information received by the communication module 30 was displayed on the first display surface 13b as a message, messages are not limited to something related to the receipt of the communication information. For example, messages can be a notification related to a process of a program such as a notification of the portable terminal device 100 being out of service, error notification, etc. In this case, while the portable terminal device 100 is in a state of the first configuration, the error notification is displayed on the first display surface 13b. In response, when the portable terminal device 100 is switched from the first configuration to the second configuration, as information attached to the message, a name of the application of processing error, etc., are displayed on the second display surface 25d.

The third embodiment of the present invention may be modified variously and suitably within the scope of the technical idea described in claims.

In the third embodiment, by making the message notifying a receipt of the communication information to be easily recognized by the user, the interests, functionality and additional value by the display on the portable terminal device are improved.

As described above, according to the portable terminal device of the present invention related to the third embodiment, a user can easily recognize the message notifying the receipt of the communication information.

<Fourth Embodiment>

Figure 23:
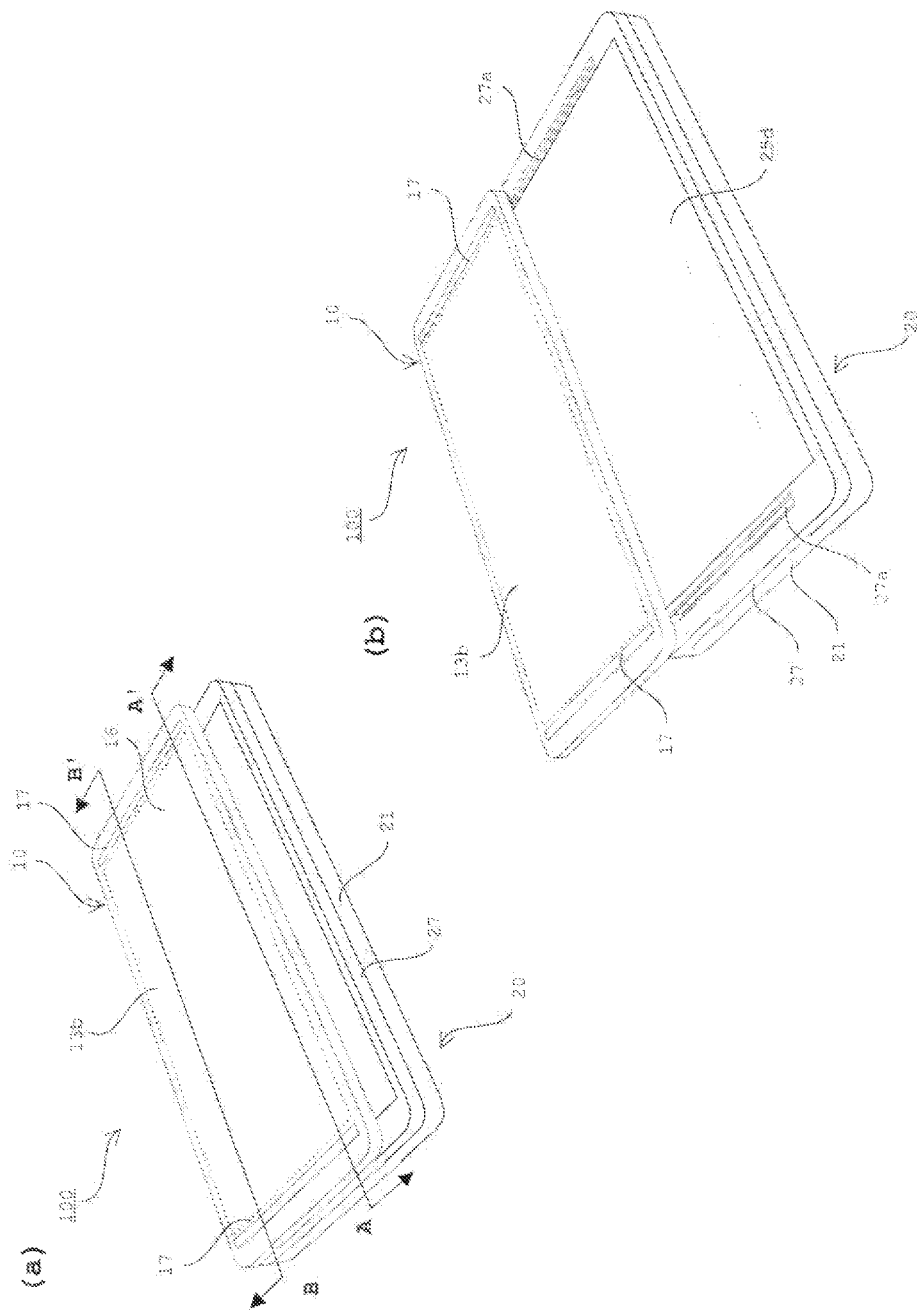
FIGS. 23(a) and 23(b) are diagrams showing a perspective overview of the portable terminal device according to the embodiment.
Figure 24:
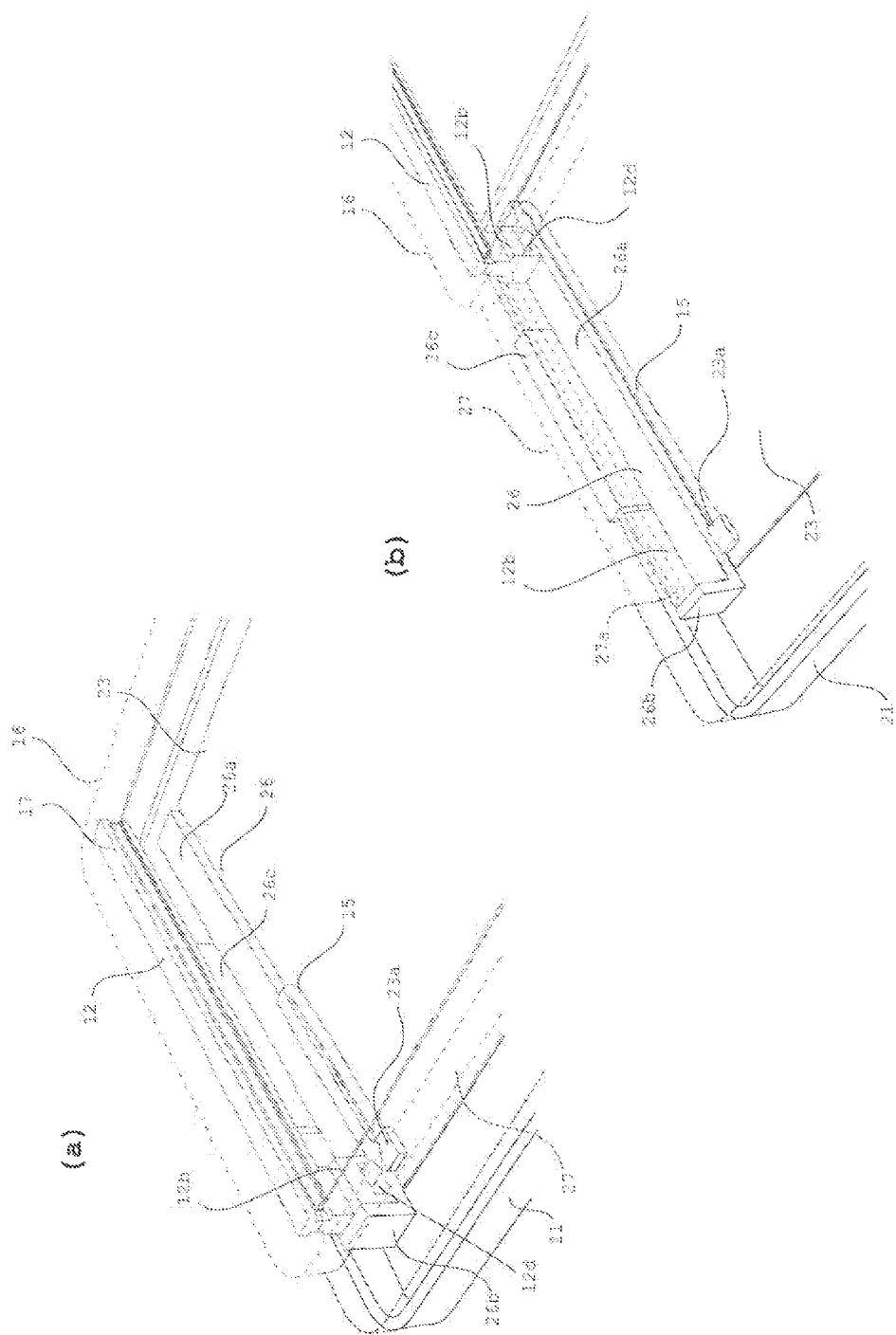
FIGS. 24(a) and 24(b) are diagrams showing perspective views to explain operations of the portable terminal device according to the embodiment.

The portable terminal device 100 related to the firth embodiment provides constructions shown in FIGS. 3, 23 and 24. That is, the portable terminal device 100 related to the present embodiment provides similar constructions as in the portable terminal device 100 related to the first embodiment. However, as shown in FIGS. 23 and 24, in a direction the second unit 20 slides, a size of the second unit 20 is larger than the size of the first unit 10. Also, in the direction the second unit 20 slides, the size of the second display module 25 (the second display surface 25d) is made larger than the size of the first display module 13 (the first display surface 13b) too. For this reason, as shown in FIG. 23(a), in the first configuration, that is, in a state where an overlapping part of the first unit 10 to the second display module 25 is maximum, a part of the second display surface 25d is not overlapped with the first unit 10, but exposed outside. Display screens displayed on the first display surface 13b and the second display surface 25d are displayed as if the part of the second display surface 25d exposed outside comes to the top side of the display screen (see FIG. 27).

Figure 25:
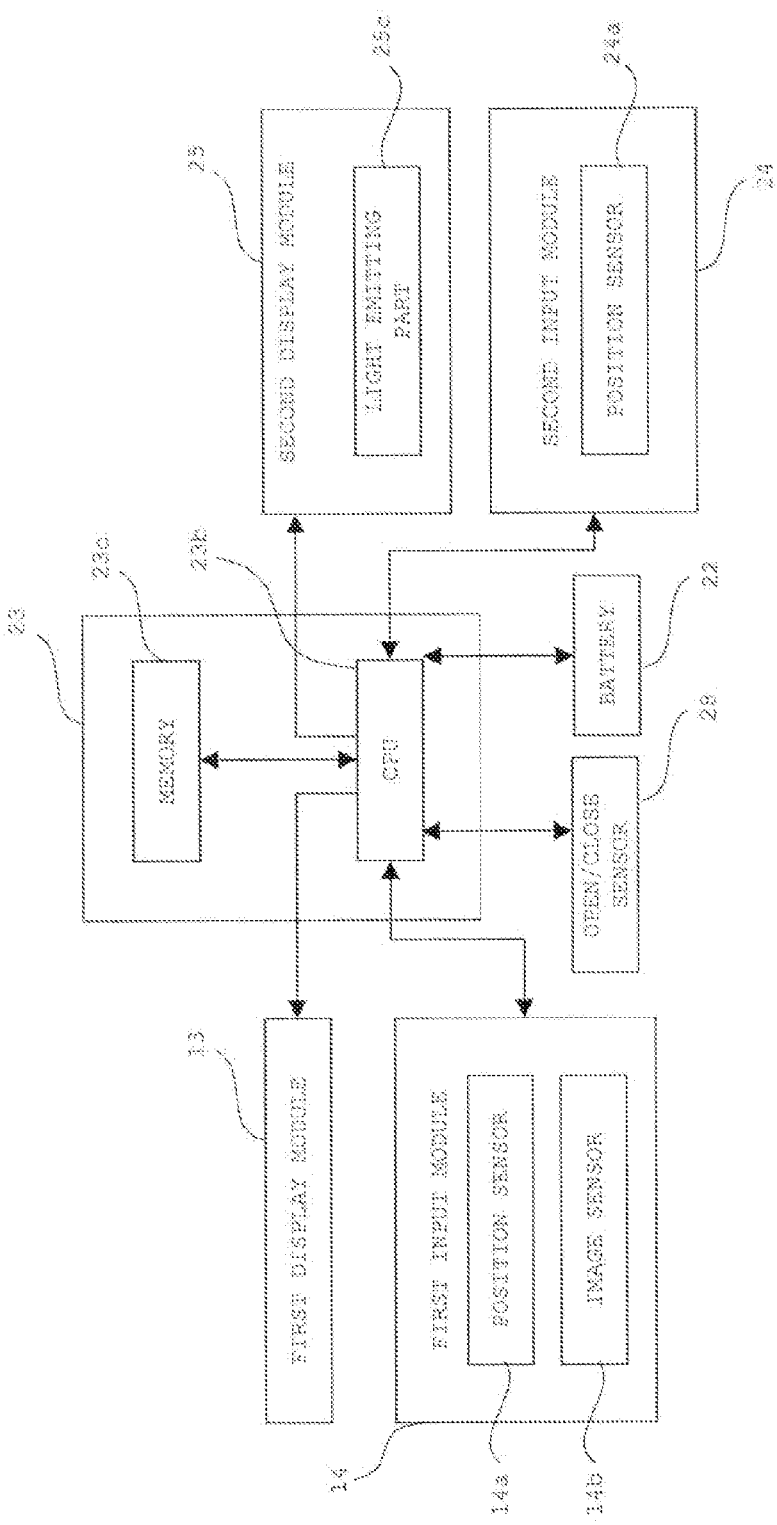
FIG. 25 is a block diagram showing a circuit of the portable terminal device according to the embodiment.

FIG. 25 shows a block diagram of a circuit of the portable terminal device 100.

The CPU 23b obtains image data such as photos, pictures, diagrams, and so on, according to the requests of instruction from the user and software. The image data is obtained by reading out from the memory 23c, receipt by the internet, etc. The CPU 23b outputs the image data as signals to each of the first display module 13 and the second display module 25, and displays images on each of the display modules 13 and 25. To the display modules 13 and 25, the CPU 23b can make the display modules 13 and 25 display different images or one image by dividing it. It is noted that when the image is displayed on the second display module 25, the CPU 23b has the electricity from the battery 22 supplied to the emitting part 25c, and makes the emitting part 25c emit.

Also, the CPU 23b receives positional signals from positional sensors 14a and 24a of each input module 14 and 24, and performs the process according to the positional signals. For example, inside the memory 23c, a positional table is stored. The position of the icons on each of the display modules 13 and 25 is associated with files and programs (applications) the icons show in the positional table. When positional signals are input from the position sensors 14a and 24a, the CPU 23b specifies the icon the user operated and performs the programs, etc., corresponding to the icon by using this positional table.

Further, the CPU 23b receives an image signal from an image sensor 14b of the first input module 14 and processes the image signal. For example, when the image signal is received, the CPU 23b specifies characters included in an image of the image signal by OCR (Optical Character Recognition) and obtains character data.

Moreover, when there is a detection signal from the open/close sensor 28, the CPU 23b determines that the first unit 10 is overlapping the most over the second unit 20, that is, the portable terminal device 100 is in the first configuration. On the other hand, when there is no detection signal from the open/close sensor 28, the CPU 23b determines that the first unit 10 is pulled out to the outside, that is, the portable terminal device 100 is in the second configuration.

Figure 26:
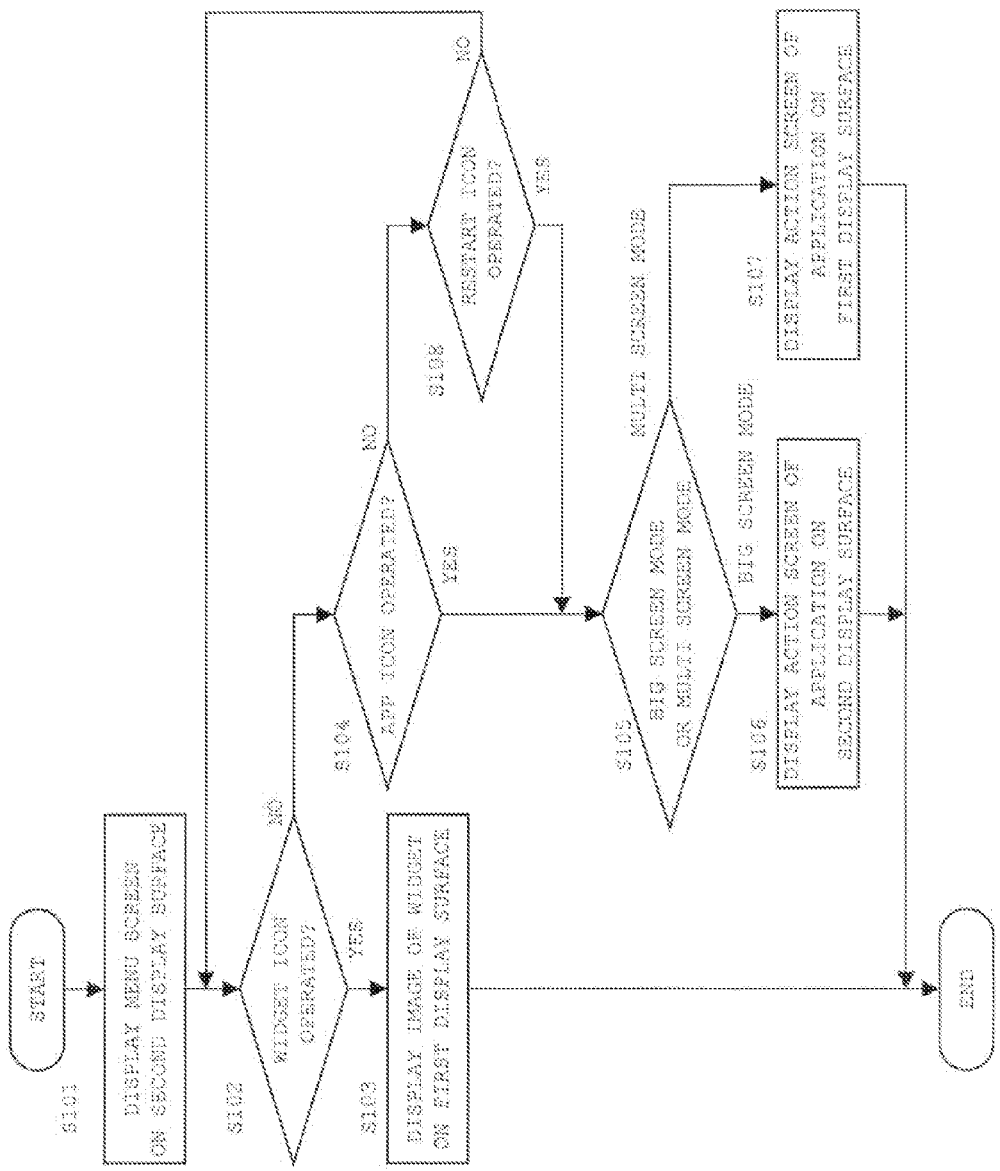
FIG. 26 is a flow chart showing a procedure for processing a display control on the first display module and the second display module according to the embodiment.
Figure 27:
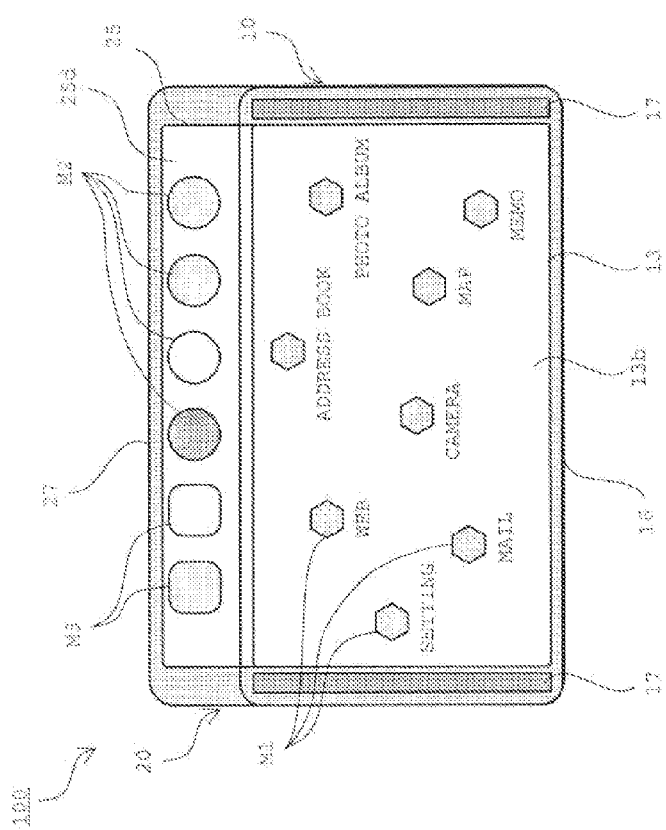
FIG. 27 is a diagram showing a state displaying a menu screen on the second display surface in a first configuration according to the embodiment.
Figure 28:
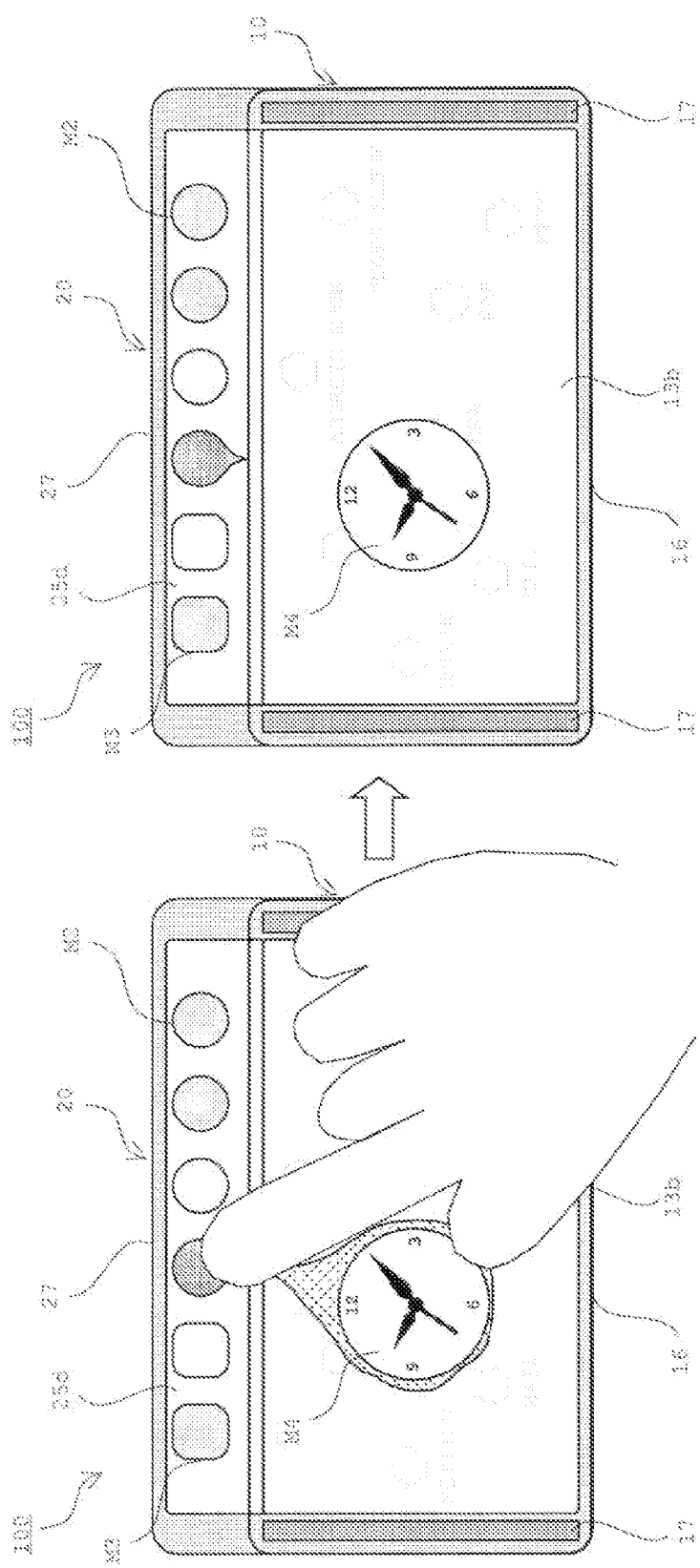
FIG. 28 is a diagram showing a state that a widget of a clock is activated in the first configuration according to the embodiment.
Figure 29:
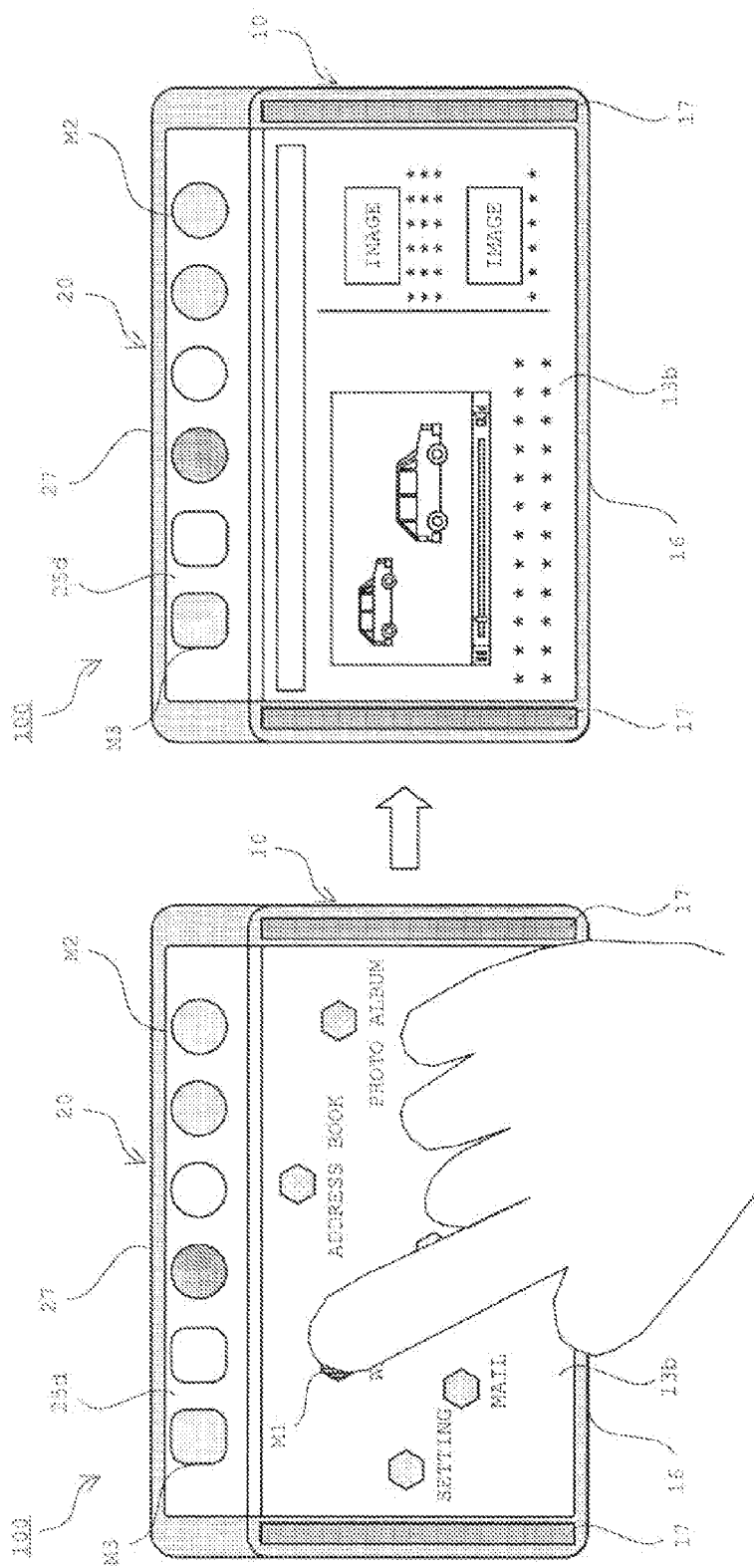
FIG. 29 is a diagram showing a state that a browser is activated in the first configuration according to the embodiment.
Figure 30:
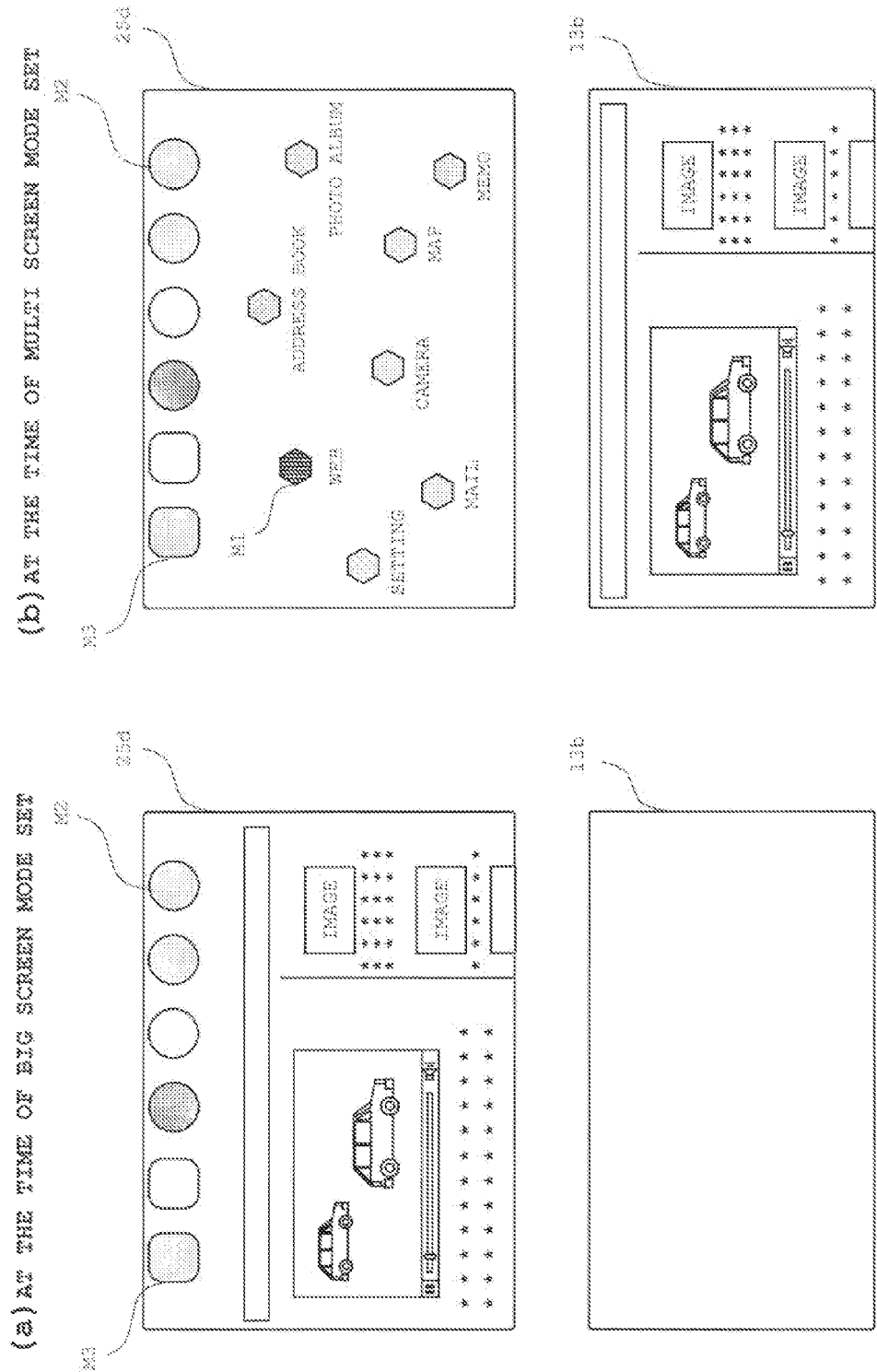
FIGS. 30(a) and 30(b) are diagrams showing display states of the first and second display surfaces when the browser is activated in the first configuration according to the embodiment.
Figure 31:
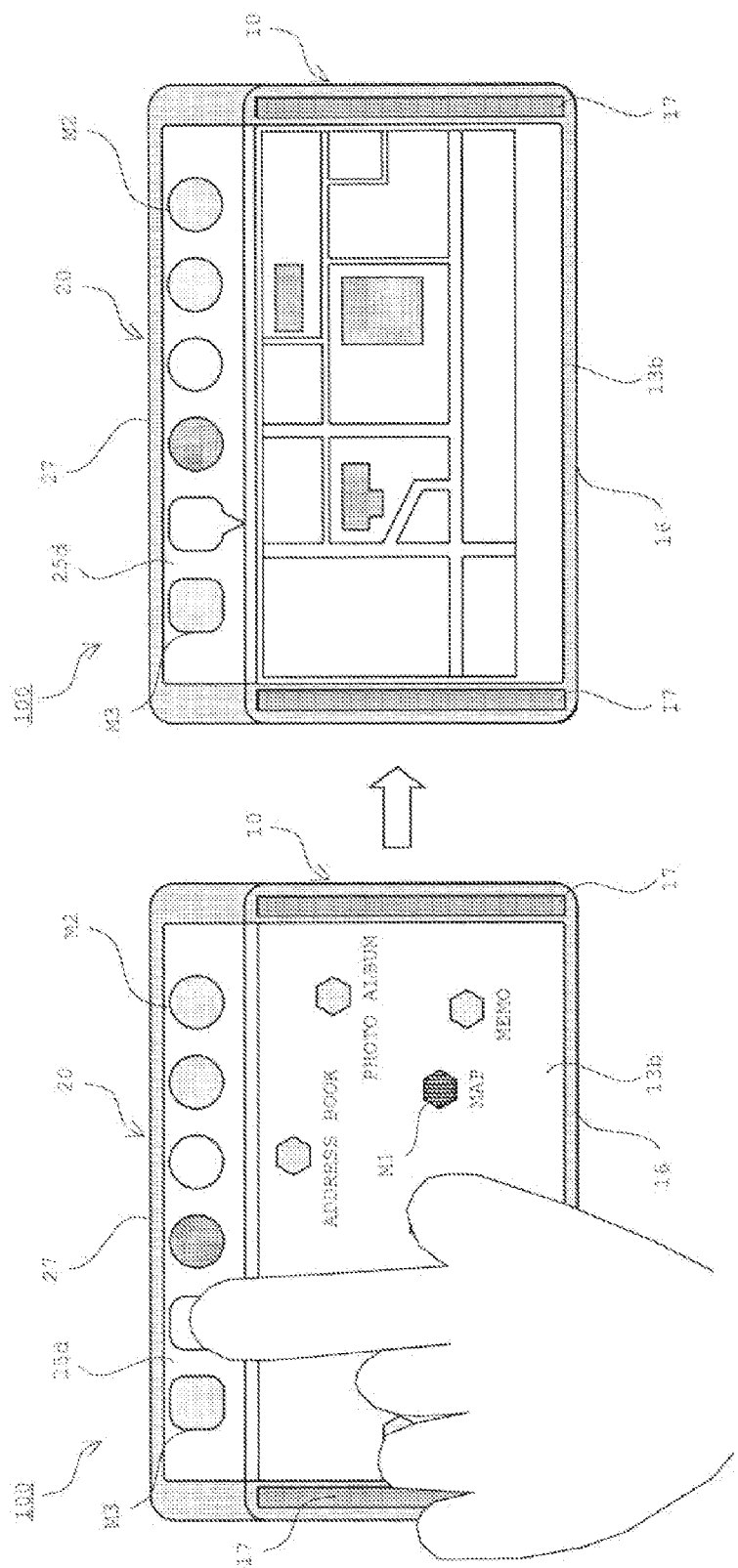
FIG. 31 is a diagram showing a state that an application of a map is restarted in the first configuration according to the embodiment.
Figure 32:
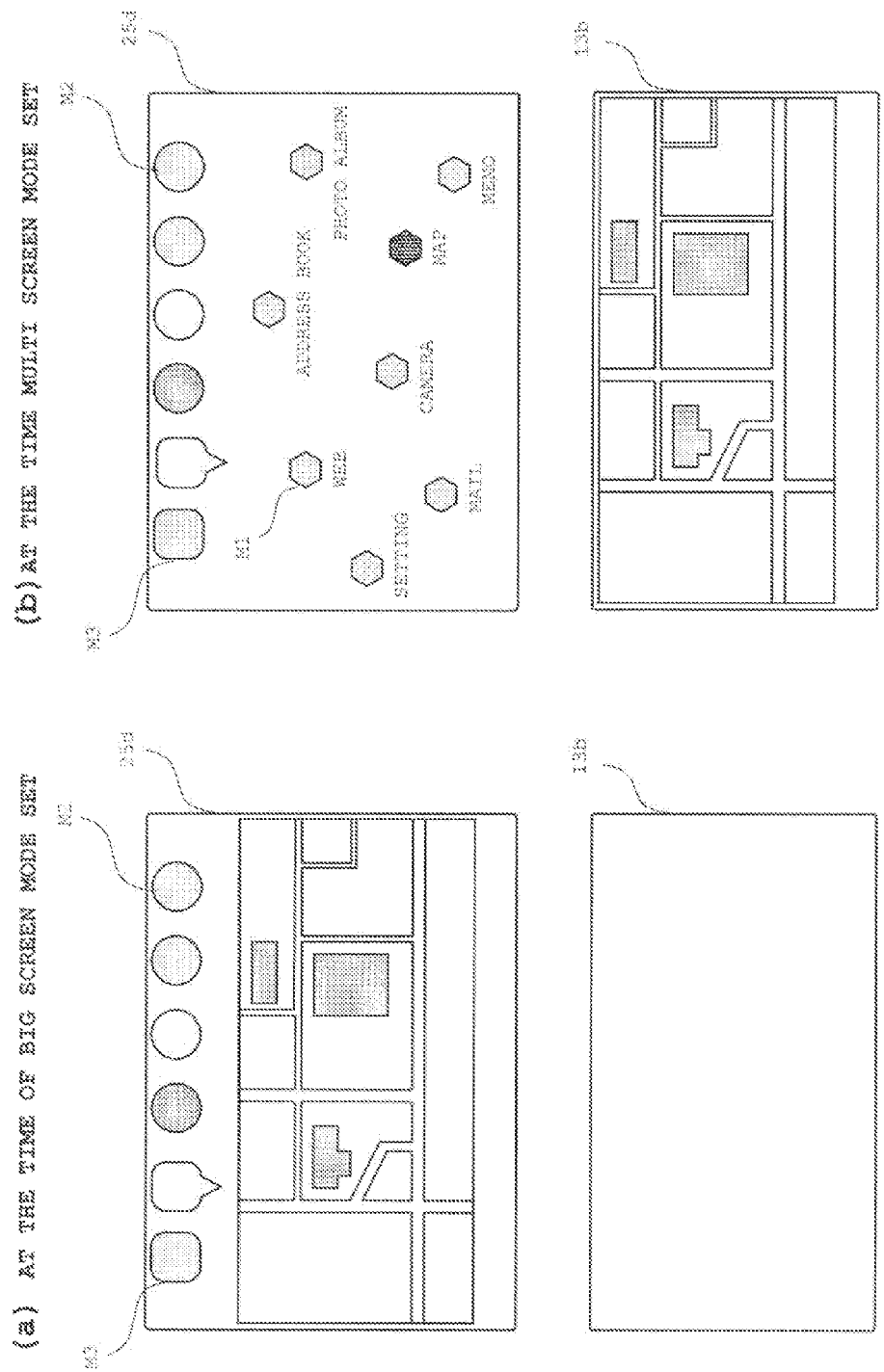
FIGS. 32(a) and 32(b) are diagrams showing display states of the first and the second display surfaces when the application of the map is restarted in the first configuration according to the embodiment.

FIG. 26 is a flow chart showing a procedure for processing a display control on the first display module 13 and the second display module 25. FIG. 27 is a diagram showing a state displaying a menu screen on the second display surface 25*d* in the first configuration. FIG. 28 is a diagram showing a state that a widget of a clock is activated in the first configuration. FIG. 29 is a diagram showing a state that a browser is activated in the first configuration. FIGS. 30(*a*) and (*b*) are diagrams showing display states of the first display surface 13*b* and the second display surface 25*b* when the browser is activated in the first configuration. FIG. 30(*a*) shows a display state in which the big screen mode is set, and FIG. 30(*b*) shows a display state in which the multi screen mode is set. FIG. 31 is a diagram showing a state that an application of a map is restarted in the first configuration. FIGS. 32(*a*) and (*b*) are diagrams showing display states of the first display surface 13*b* and the second display surface 25*d* when the application of the map is restarted in the first configuration. FIG. 32(*a*) shows the display state when the big screen mode is set, and FIG. 32(*b*) shows the display state when the multi screen mode is set. It is noted that, in FIGS. 30 and 32, to make it easier to show the display states of each display surface 13*b* and 25*d*, the first display surface 13*b* and the second display surface 25*d* are drawn separately even though they actually are overlapping to each other.

Referring to FIG. 26, in the state of the first configuration, when power is applied to the portable terminal device 100, the CPU 23*b* displays the menu screen on the second display surface 25*d* (S101). As shown in FIG. 27, the menu screen displays icons M1 to activate the applications of browsers, address books, e-mails, and so on (hereinafter, referred to as "app-icon"), and icons M2 to activate the widgets, such as a clock, thermometer, etc (hereinafter, referred to as "widget-icon"). Also, if there is an application suspended, an icon M3 for restarting the application (hereinafter, referred to as "restart-icon") is displayed. In the second display surface 25*d*, the app-icons M1 are displayed on an area covered with the first unit 10, and the widget-icons M2 and the restart-icons M3 are displayed on an area without covered with the first unit 10 (an area exposed to the outside). At this time, since the first display module 13 is made to be an off state by the CPU 23*b*, the first display module 13 is in a transparent state (a see through state), therefore the user can see the app-icons M1 through the first display surface 13*b*.

The CPU 23*b* detects whether any of the widget-icons M2, app-icons M1, and restart-icons M3 is operated or not on the menu screen (S102, S104 and S106).

For example, as shown in FIG. 28, when a user pressed a widget-icon M2 corresponding to a widget of a clock, the CPU 23*b* determines that the widget icon M2 corresponding to the widget of the clock is operated based on the positional signal from the positional sensor 24*a* of the second input module 24 (S102: YES). Then, the widget of the clock is activated, and an image of the clock M4 is displayed on the first display surface 13*b* (S103). At this time, on the second display surface 25*d*, an app-icon M1 in an area overlapping with the first display surface 13*b* is displayed thinly so as not to stand out.

On the other hand, for instance, as in FIG. 29, when an app-icon M1 corresponding to a browser is pressed, the CPU 23*b* determines the position user touched on the second display surface 25*d*. At this time, in the display area of the app-icon M1, the second input module 24 is under the first unit 10, therefore the positional detection by the position sensor 24*a* cannot be performed. Thus, the position sensor 14*a* of the first input module 14 performs the position detection instead.

When the CPU 23*b* determines that the app-icon M1 corresponding to the browser is operated based on the positional signal from the position sensor 14*a* (S104: YES), next, which of the big screen mode or the multi screen mode is set is determined (S105). The big screen mode is a mode constructing one big display surface with the first display surface 13*b* and the second display surface 25*d* when the portable terminal device 100 is turned to the second configuration, and on one big display surface, one display screen is displayed (see FIG. 34(*a*)). The multi screen mode is a mode utilizing the first display surface 13*b* and the second display surface 25*d* individually when the portable terminal device 100 is turned to the second configuration, and each display surface 13*b* and 25*d* displays different display screens (see FIG. 34(*b*)). The screen mode is, for example, set by a user in advance by using the predetermined setting screen.

When the CPU 23*b* determines that the display mode is set to be the big screen mode (S105: the big screen mode), as shown in FIG. 30(*a*), an action screen of an activated application, in this case, a web screen obtained from a browser, is displayed on the second display surface 25*d* (S106). At this time, the web screen is displayed in the area app-icon M1 was displayed, and display of the widget icon M2 and restart icon M3 is kept as it is. The CPU 23*b* keeps the first display module 13 in off state. This makes the first display module 13 stay transparent, and the user can see the web screen through the first display surface 13*b*.

On the other hand, when the CPU 23*b* determines that the screen mode is set to be the multi screen mode (S105: the multi screen mode), as shown in FIG. 30(*b*), the web screen obtained from the browser is displayed on the first display surface 13*b* (S107). At this time, the menu screen continues to be displayed on the second display surface 25*d* as it is. However, as in FIG. 29, since the web screen displayed on the first display surface 13*b* hides the menu screen, the menu screen cannot be seen.

Next, for example, while an application of a map is suspended (in a state not working on the display surface), as shown in FIG. 31, restart icon M3 to restart the application of the map is pressed by the user, the CPU 23*b* determines that the restart icon M3 to restart the application of the map is operated based on a positional signal from the position sensor 24*a* of the second input module 24 (S108: YES).

When the screen mode is set to the big screen mode (S105: the big screen mode), the CPU 23*b* displays an action screen of the operated application, in this case, the map screen on the second display surface 25*d*, as shown in FIG. 32(*a*) (S106). The first display module 13 is still in the transparent state, so the user can see the map screen through the transparent first display surface 13*b*.

In contrast, when the CPU 23*b* is determined that the screen mode is set to be the multi screen mode (S105: the multi screen mode), as shown in FIG. 32(*b*), the map screen is displayed on the first display surface 13*b* (S107). It is noted that, the menu screen on the second display surface 25*d* is hidden by the web screen displayed on the first display surface 13*b* and cannot be seen, as in the FIG. 31.

Figure 33:
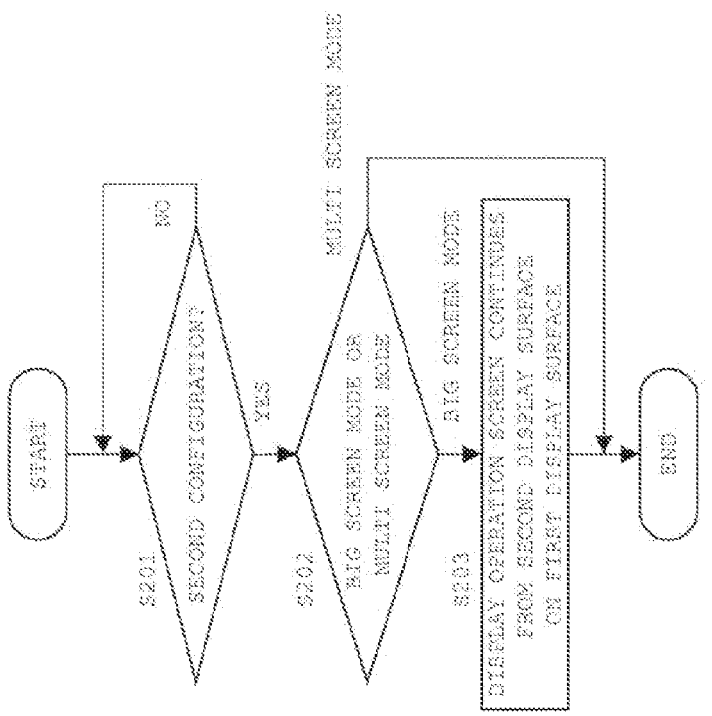
FIG. 33 is a flow chart showing a procedure for processing a display control when the first configuration is switched to the second configuration while the application is in operation according to the embodiment.
Figure 34:
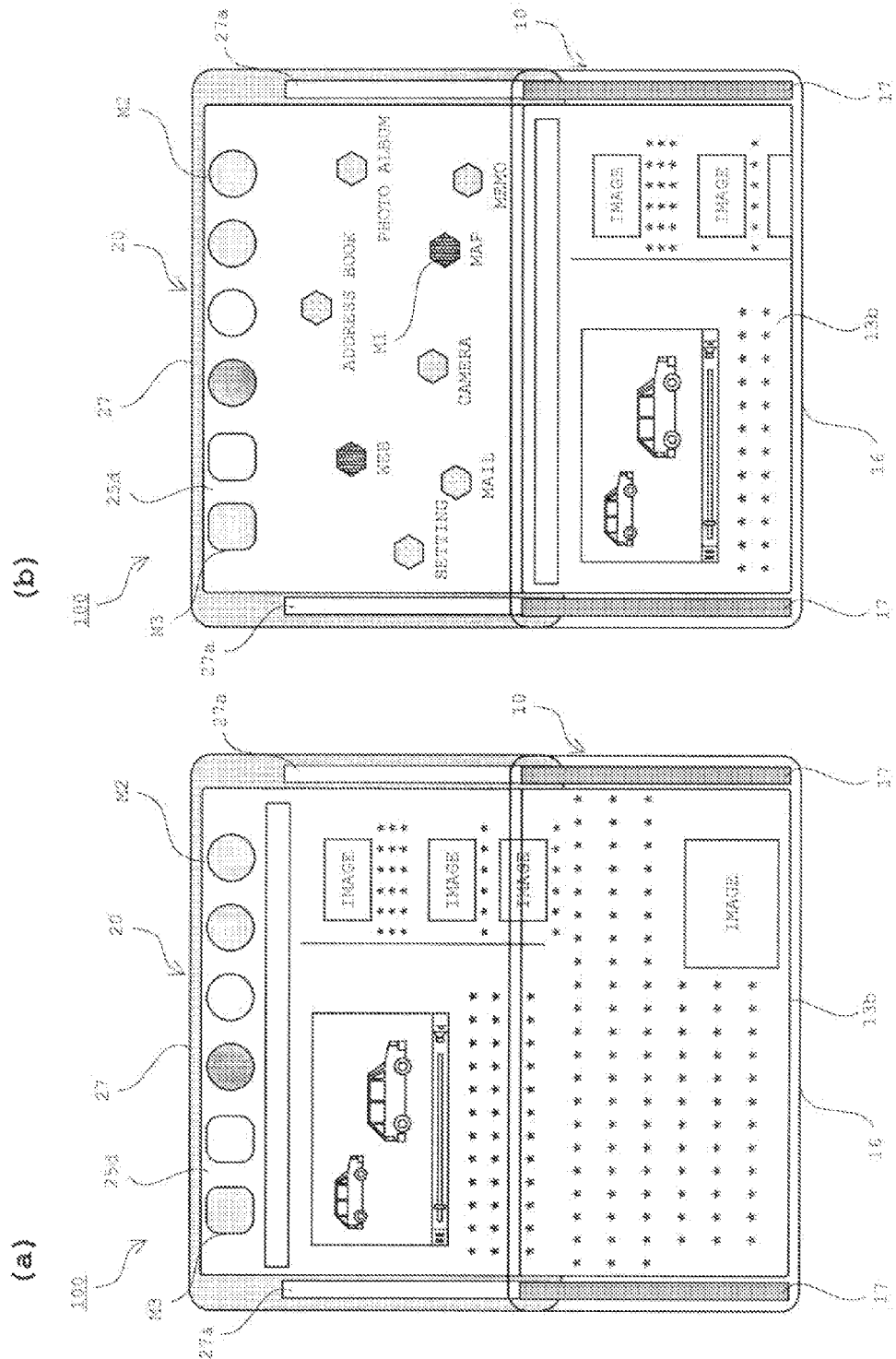
FIGS. 34(a) and 34(B) are diagrams showing display states of the first and the second display surfaces when the first configuration is switched to the second configuration according to the embodiment.

FIG. 33 is a flow chart showing a procedure for processing a display control when the first configuration is switched to the second configuration while the application is in operation. FIG. 34(*a*) shows the display state that the big screen mode is set, and FIG. 34(*b*) shows the display state that the multi screen mode is set.

Referring to FIG. 33, the CPU 23*b* determines, for example, as shown in FIGS. 29 and 31, in the first configuration, while the application is performed, whether the first configuration turns to the second configuration or not (S201). When the first unit 10 is pulled out to the outside by the user and turned to be the second configuration, the detection signal from the open/close sensor 28 to the CPU 23b would stop being output.

When the CPU 23b is determined to be the second configuration (S201: YES), it is determined whether the screen mode is set to be the big screen mode or the multi screen mode (S202).

When the screen mode is set to be the big screen mode, as shown in FIGS. 30(a) and 32(a), the second display surface 25d displays an action screen of an application in operation, and the first display surface 13b is a see through state.

When the CPU 23b determines that the screen mode is set to be the big screen mode (S202: big screen mode), as shown in FIG. 34(a), it keeps the action screen of the second display surface 25d, and displays on the first display surface 13b an action screen continues from the action screen of the second display surface 25d (S203). As such, on a big display surface which is constructed by the first display surface 13b and the second display surface 25d put together, one action screen is displayed.

On the other hand, when the screen is set to be the multi screen mode, as shown in FIGS. 30(b) and 32(b), a menu screen is displayed on the second display surface 25d, and on the first display surface 13b, an action screen of an application in operation is displayed.

When the CPU 23b determines that the screen mode is set to be the multi screen mode (S202: the multi screen mode), as shown in FIG. 34(b), it keeps the menu screen on the second display surface 25d and the action screen of the first display surface 13b as they are. As such, two display surfaces 13b and 25d are aligned side by side, and each display surface 13b and 25d displays the action screen of an application and the menu screen, respectively.

As shown in FIG. 34, when the portable terminal device 100 is switched to the second configuration, the first unit 10 is pulled down to the bottom direction of the display screens displayed on the first display surface 13b and the second display surface 25d with respect to the second unit 20.

In the present embodiment, in the first configuration, the action screen of an activated application is displayed on the second display surface 25d, and the first display surface 13b is kept to be a transparent state. When it is switched to the second configuration, the action screen continues from the second display surface 25d is displayed on the first display surface 13b. Thus, when the portable terminal device 100 is switched to the second configuration, without changing the display state of the second display surface 25d, and just displaying the action screen continues from the action screen of the second display surface 25d on the first display surface 13b, it is capable of displaying one action screen on a big display surface that both display surfaces 13b and 25d are put together. Because of this, the control processing to the first display module 13 and the second display module 25 can be simplified.

Unlike the present embodiment, if the activated application is displayed on the first display surface 13b in the first configuration, when the portable terminal device 100 is switched to the second configuration, the action screen displayed on the first display surface 13b is displayed on the second display surface 25d and the action screen continues from the action screen needs to be displayed on the first display surface. Thus, the control processing becomes more complex accordingly.

Also, in the present embodiment, in the first configuration, a menu screen to activate each application is displayed on the second display surface 25d, and the first display surface 13b is kept in the transparent state. When a predetermined application is activated by the operation on the menu screen, the action screen of that application is displayed on the first display surface 13b. Thus, when the portable terminal device 100 is switched to the second configuration after the application is activated, by simply making the display state of both display surfaces 13b and 25d to the same as the ones before the switch, the action screen of the application and the menu screen can be displayed on the first display surface 13b and the second display surface 25d aligned side by side, respectively. This allows the control process on the first display module 13 and the second display module 25 to be simplified.

Next, when the app-icon M1 corresponding to the application of an e-mail from the menu screen of FIG. 27 is operated, the application of an e-mail is activated. Further, in the initial screen, etc., of the application for e-mails, when a shift operation to document composing screens to compose a mail document is performed, the document composing screens are displayed on the first display surface 13b and the second display surface 25d. The user composes the mail document on the document composing screens and transmits the mail document to a recipient.

Figure 35:
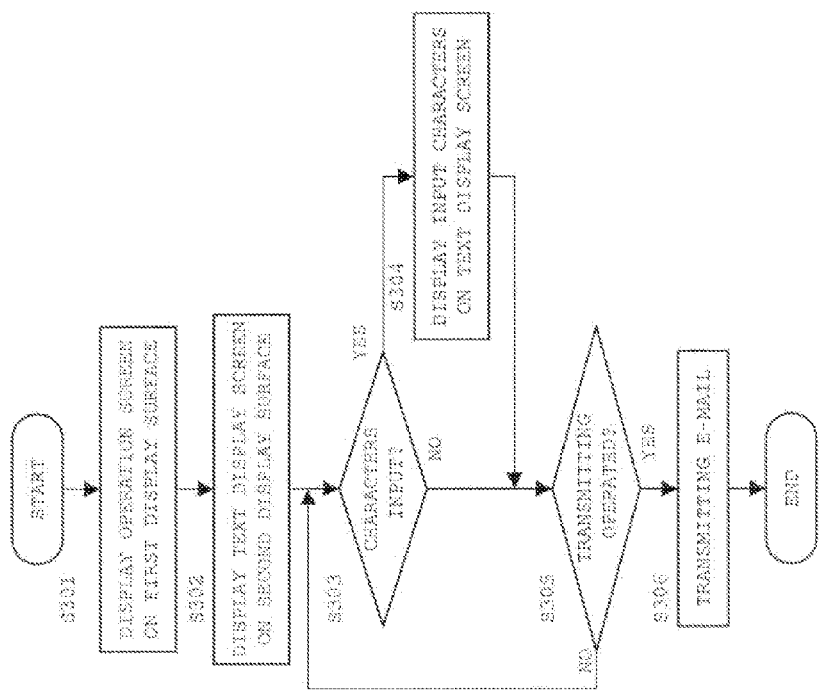
FIG. 35 is a flow chart showing a procedure for processing to control to create and transmit a mail document according to the embodiment.
Figure 36:
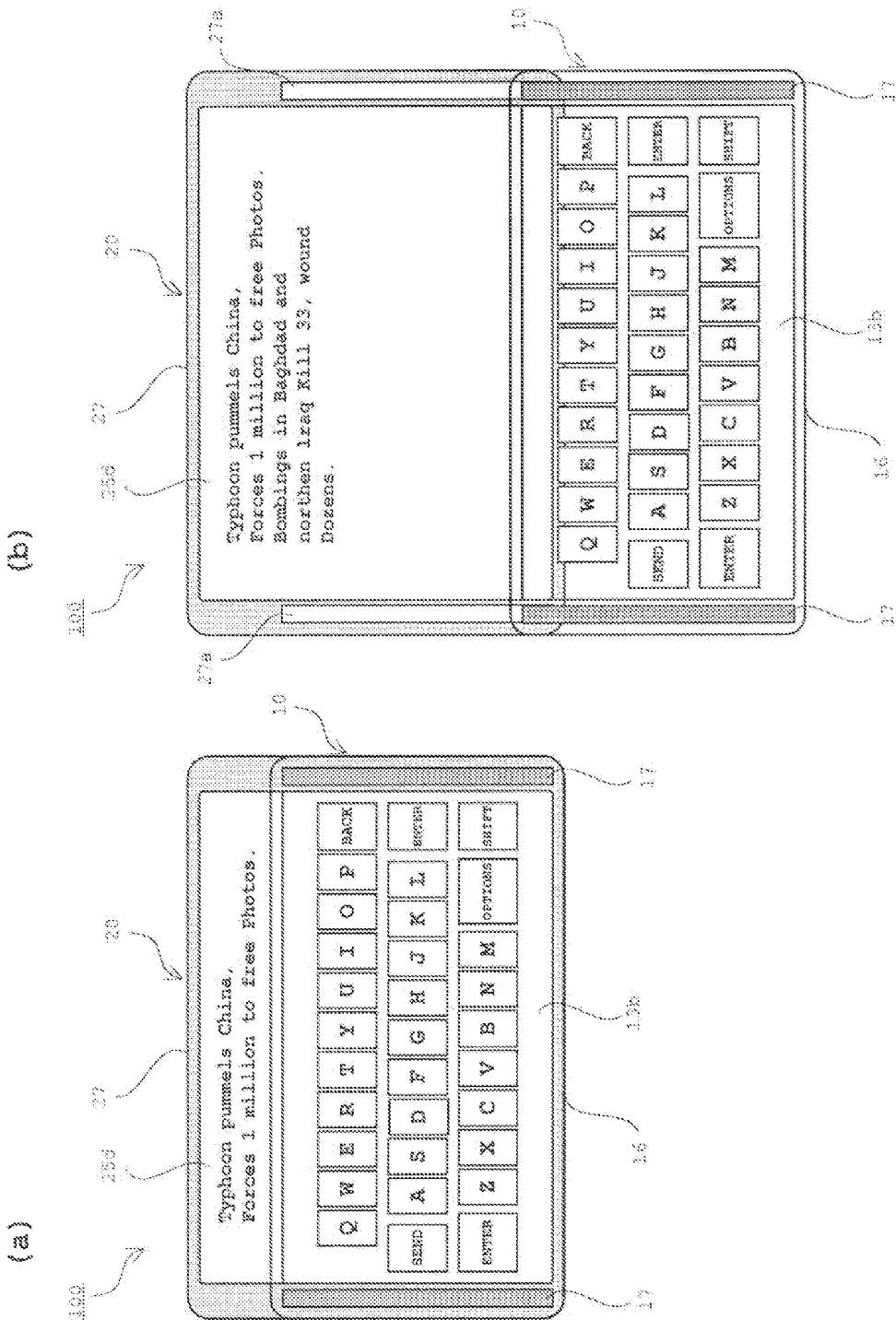
FIGS. 36(a) and 36(b) are diagrams showing a state to display a mail composing screen on the first display surface and the second display surfaces according to the embodiment.

FIG. 35 is a flow chart showing the procedure for processing to control to compose and transmit a mail document. FIGS. 36(a) and (b) are diagrams showing a state the document composing screens are displayed on the first display surface 13b and the second display surface 25d. FIG. 36(a) shows the display state in the first configuration and FIG. 36(b) shows the display state in the second configuration.

Referring to FIG. 35, when the shift operation to the document composing screens is performed, the CPU 23b displays an operation screen on the first display surface 13b (S301) and displays a text display screen on the second display surface 25d (S302) as the text composing screens. For example, the first display surface 13b displays a key board (QWERTY key). Nothing is displayed around the key board, and it is in a transparent state. Or, a predetermined background color is added around the key board. On the text display screen, characters typed by the key board, etc., are displayed.

When the characters, numbers, symbols, etc., are input (S303: YES), as shown in FIG. 36(a), the CPU 23b displays the input characters, etc., from top left position of the text display screen, to be horizontal writing, sequentially (S304).

As such, inputting of the mail document is finished, and the transmitting operation is performed by the user (S305: YES), the CPU 23b transmits the mail document to an designated address (e-mail address) with the transmitting operation (S306).

In the present embodiment, in the first configuration, that is, in the state that the second unit 20 overlaps to the first unit 10 at the largest, the top part of the second display surface 25d sticks out from the first unit 10. For this reason, as shown in FIG. 36(a), when the writing fits in the area sticking out on the second display surface 25d, the user can check the input writing without pulling out the first unit 10 and making the device to be the second configuration but keeping the device as the first configuration, that is, while the portable terminal device 100 is kept in a compact state.

On the other hand, when the input writing is long and does not fit in the area sticking out on the second display surface 25d, the user pulls out the first unit 10 and making the device in second configuration, as shown in FIG. 36(b). This makes the area of the second display surface 25d exposed outside, that is, the text display screen is made larger, so the input writing can be displayed on the enlarged text display screen.

Besides, even when the portable terminal device 100 is switched from the first configuration to the second configuration, the CPU 23b displays the operation screen on the first display surface 13b and keeps the text input screen displayed on the second display surface 25d, and there is no need to change the display states of each display surface 13b and 25d. Thus, the control processing on the first display module 13 and the second display module 25 can be simplified.

As explained above, in the present embodiment, in the state that the first unit 10 overlaps to the second unit 20 at the largest, since it is constructed to be exposed to outside a part of the area of the second display surface 25d, on that part of the area exposed, widget icons M2, restart icons M3, etc., can be displayed, or a text display screen can be displayed. Thus, the interest, functionality and additional value by the display can be improved.

Also, in the present embodiment, in the state that the first unit 10 overlaps to the second unit 20 at the largest, the first display surface 13b and the second display surface 25d are physically divided, it is easier to find that the protruded second display surface 25d and the first display surface 13b are two different display areas. Thus, the user tends to find this protruded second display surface 25d interesting, and by displaying the information as the above on this second display surface 25d, additional value can be added to the portable terminal device 100. Especially, as the above embodiment, when the display is performed by combining an area in which the first display surface 13b, which is made transparent, and the second display surface 25d are overlapped each other, and an area in which the second display surface 25d protrudes, an interest and functionality by the display improve further.

Also, in the present embodiment, since the protruding second display surface 25d is used for a display, for example, compared to a case when the second display surface 25d is completely covered with the first unit 10 without protruding any parts, the display area is bigger. Therefore, by utilizing the protruding second display surface 25d, a predetermined application can be displayed bigger on the first display surface 13b.

It is noted that, when the overlapping part of the first unit 10 against the second unit 20 is at its maximum, the second unit 20 does not protrude so much from the first unit 10, in this state, the portability of the portable terminal device 100 would not be impaired.

As such, in the present embodiment, without losing so much the portability of the portable terminal device 100, interests and functionality on display of the portable terminal device 100 can notably be improved.

<Modification Example>

The embodiment of the present invention has been described above, but the present invention is not limited to the above embodiment, and the embodiment of the present invention may be variously modified.

For example, in the above fourth embodiment, by using a transparent liquid crystal display instrument for the first display module 13 and by constructing the first bottom part 11 and first lid part 16 with transparent materials, even when the portable terminal device 100 is in closed state, the display screen of the second display surface 25d can be seen through the first unit 10. However, not limited to this, the first unit 10 can be constructed the same as the second unit 20. That is, by using the same liquid crystal display instrument with the second display module 25 to the first display module 13, and by constructing the first bottom part 11 and the lid part 16 with opaque materials, when the portable terminal device 100 is closed, and the second display surface 25d is covered with the first unit 10, it may be constructed as the display screen of the second display surface 25d cannot be seen.

Also, the above fourth embodiment, in a state where an overlapping part of the first unit 10 to the second display module 25 is maximum, top part of the second display surface 25d is exposed outside. However, it does not need to be limited to this, but the bottom part of the second display surface 25d can be exposed outside, or a right end part or a left end part can be exposed to the outside. It is noted that, if it is constructed to have the right end part or left end part of the second display surface 25d is exposed outside, the moving direction of the first unit 10 is better to be a left and right direction of the second display surface 25d, but not the up and down direction of the second display surface 25d as in the above fourth embodiment.

Further, in the above fourth embodiment, the first unit 10 was arranged being capable of move linearly with respect to the second unit 20, the first unit 10 can be arranged to rotate around a predetermined axis vertical to the display surface to the second unit 20. Also, the portable terminal device 100 can be a flip phone. That is, the first unit 10 can be arranged to rotate around a predetermined axis horizontal to the display surface to the second unit 20.

The fourth embodiment of the present invention may be modified variously and suitably within the scope of the technical idea described in claims.

REFERENCE SIGNS LIST

100 Portable terminal device
10 First unit
12 Sliding part (switching module)
13 First display module
13b First display surface
14 First input module
20 Second unit
23b CPU (display control module, extracting module)
23b1 Display control module
23b2 Communication information processing module
24 Second input module
25 Second display module
25d Second display surface
27a Guiding hole (switching module)
30 Communication module (information receiving module)
106 Transmitting module
107 Receiving module

The invention claimed is:

1. The portable terminal device comprising:
a first unit which has a first display module, and is configured such that a user is allowed to see a scenery at a side of the first unit opposite to a user's side through the first display module;
a second unit which has a second display module;
a switching module which is operable to switch the portable terminal device between a first configuration that the first unit covers the second display module, and a second configuration that the first unit is moved from the first configuration with respect to the second display module so that at least a part of the second display module is exposed to an outside; and
a controller which allows the user to designate a portion of an original image as a separate object image, and which allows the user to move the separate object image to a location on the first display module showing the scenery such that the separate object image is overlapped with the scenery,
wherein the controller comprises
an extracting module which receives a user designation of an outline around a portion of the original image, and extracts the portion of the original image as the separate object image, and a display control module which controls the first display module and the second display module, wherein the display control module is operative to display the object image extracted by the extracting module on the first display module, and to set a display area on the first display module other than the object image in a see-through state.

2. The portable terminal device according to claim 1, further comprising:

a position detecting module which detects a position designated on the first display module, wherein the display control module is operative to display the object image at the position detected by the position detecting module.

3. The portable terminal device according to claim 1, further comprising:

a range detecting module which detects a range designated on the original image, wherein the extracting module is operative to extract an image in the range detected by the range detecting module, as the object image.

4. The portable terminal device according to claim 1, wherein the display control module is operative to:

in the second configuration, display selection candidates of the object image on the second display module;

display the object image on the first display module in response to receiving a designation of selecting the pre-determined object image from among the displayed selection candidates, and moving the selected object image to the first display module; and set a display area on the first display module other than the object image in the see-through state.

5. The portable terminal device according to claim 1, wherein the display control module is operative to:

in the first configuration, display selection candidates of the object image on the second display module and set the first display module in the see-through state;

display the object image on the first display module in response to receiving a designation of selecting the pre-determined object image from among the displayed selection candidates, followed by switching the portable terminal device from the first configuration to the second configuration; and set a display area on the first display module other than the object image in the see-through state.

6. A portable terminal device comprising:

a first unit which has a first display module, and is configured such that a user is allowed to see a scenery at a side of the first unit opposite to a user's side through the first display module;

a second unit which has a second display module; and a controller which allows the user to designate a portion of an original image as a separate object image, and which allows the user to move the separate object image to a location on the first display module showing the scenery such that the separate object image is overlapped with the scenery in a state that the first display module and the second display module are aligned side by side, where the controller comprises an extracting module which receives a user designation of an outline around a portion of the original image, and extracts the portion of the original image as the separate object image, and a display control module which controls the first display module and the second display module, wherein the display control module is operative to display the object image extracted by the extracting module on the first display module, and to set a display area on the first display module other than the object image in a see-through state.

* * * * *